United States Patent
Kunikiyo et al.

(10) Patent No.: US 6,809,336 B2
(45) Date of Patent: Oct. 26, 2004

(54) SEMICONDUCTOR DEVICE COMPRISING SENSE AMPLIFIER AND MANUFACTURING METHOD THEREOF

(75) Inventors: Tatsuya Kunikiyo, Tokyo (JP); Takeshi Hamamoto, Tokyo (JP); Yoshinori Tanaka, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 85 days.

(21) Appl. No.: 10/207,025

(22) Filed: Jul. 30, 2002

(65) Prior Publication Data

US 2003/0045064 A1 Mar. 6, 2003

(30) Foreign Application Priority Data

Sep. 5, 2001 (JP) ........................................ 2001-268607

(51) Int. Cl.[7] .............................................. H01L 29/76
(52) U.S. Cl. ........................ 257/66; 257/351; 257/373; 438/514; 438/554
(58) Field of Search .............................. 257/66, 69, 71, 257/313, 350, 351, 369, 373, 774; 438/149, 478, 514, 517, 554

(56) References Cited

U.S. PATENT DOCUMENTS 4,847,724 A * 7/1989 Renous ........................ 361/119

| 6,157,586 A | 12/2000 | Ooishi |
| 6,181,618 B1 | 1/2001 | Inaba et al. |
| 6,207,998 B1 | 3/2001 | Kawasaki et al. |
| 6,593,629 B2 * | 7/2003 | Yamamoto ................... 257/351 |
| 2003/0168704 A1 * | 9/2003 | Harada et al. ............... 257/368 |

FOREIGN PATENT DOCUMENTS

| EP | 126499 A1 * | 11/1984 | ........... H01L/21/76 |
| JP | 9-51041 | 2/1997 | |
| JP | 10-70250 | 3/1998 | |

* cited by examiner

*Primary Examiner*—Erik J. Kielin
*Assistant Examiner*—Stephen W. Smoot
(74) *Attorney, Agent, or Firm*—Oblon, Spivak, McClelland, Maier & Neustadt, P.C.

(57) ABSTRACT

A semiconductor device is provided which avoids lowering of the sense speeds of plural sense amplifiers due to their drives. In the semiconductor device, a P-type well layer (6) containing a P-type impurity is selectively disposed in a main surface of an epitaxial layer (3). An N-type bottom layer (7) containing an N-type impurity is disposed so as to make contact with a bottom surface of the P-type well layer (6). A P-type well layer (2) is disposed in such a thickness as to make contact with the N-type bottom layer (7), so that the N-type bottom layer (7) and P-type well layer (2) form a PN junction. Further, in the main surface of the epitaxial layer (3), an N-type well layer (4) containing an N-type impurity and a P-type well layer (5) containing a P-type impurity are selectively disposed so as to sandwich therebetween the P-type well layer (6).

16 Claims, 20 Drawing Sheets

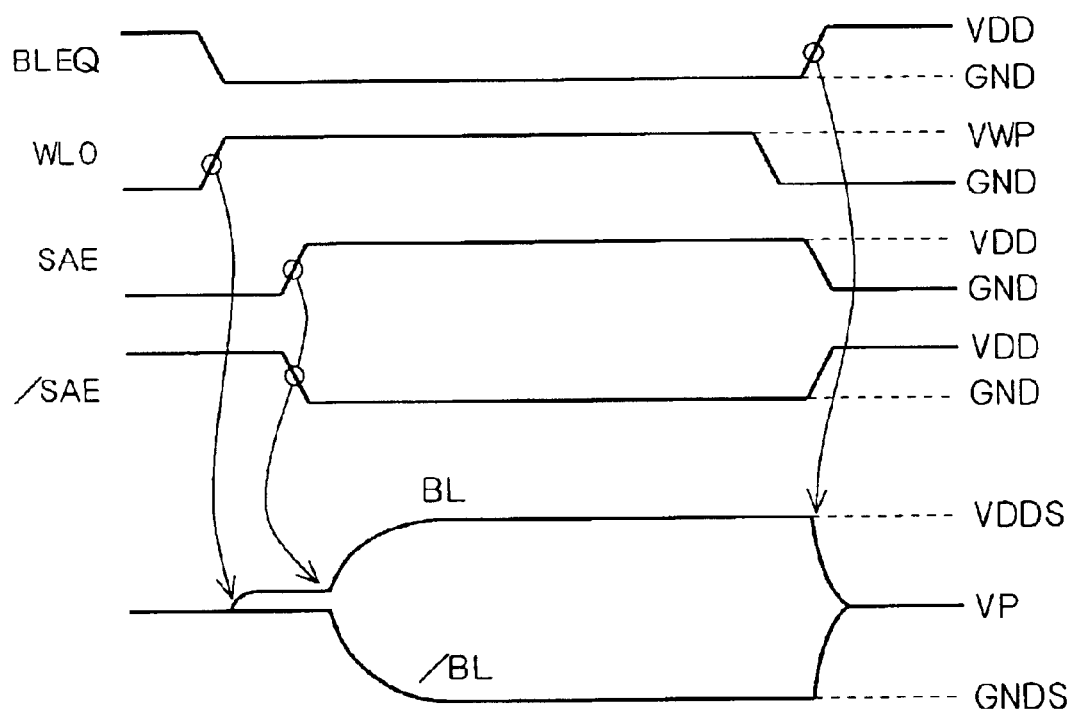
F I G. 3

F I G. 13
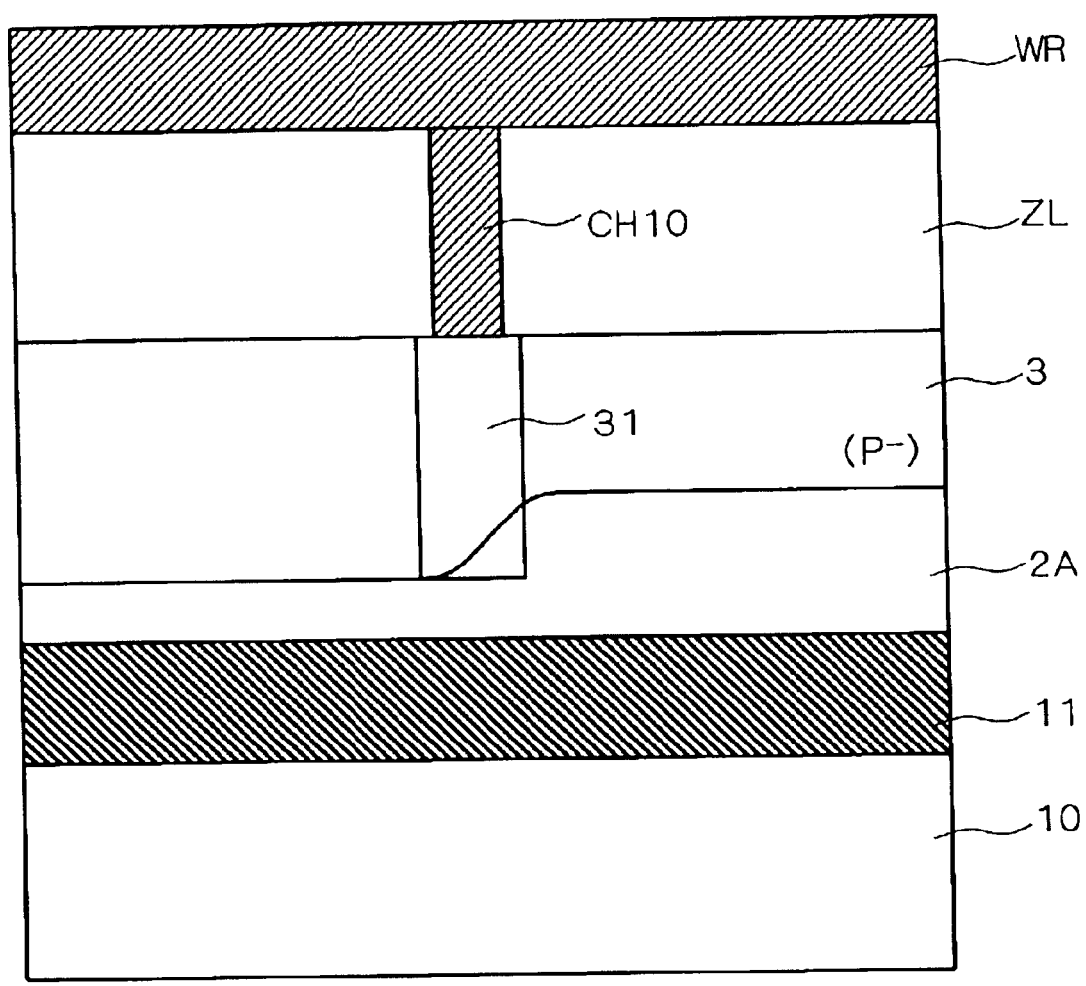

F I G. 15
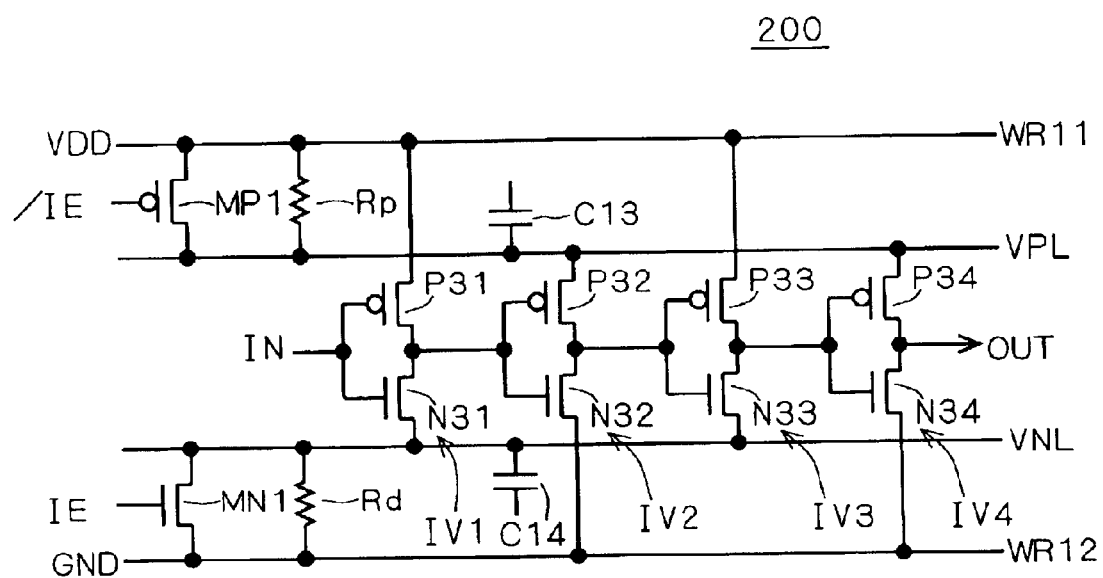

SEMICONDUCTOR DEVICE COMPRISING SENSE AMPLIFIER AND MANUFACTURING METHOD THEREOF

BACKGROUND OF THE INVENTION

1. Field of the Invention

The present invention relates to a semiconductor device and a manufacturing method thereof and, in particular, to a semiconductor device comprising a sense amplifier such as a DRAM (dynamic random access memory), as well as a method of manufacturing the same.

2. Description of the Background Art

Memory Cell Configuration

As example of DRAMs, FIG. 17 shows the configuration of a memory cell part of a one-transistor cell DRAM 90 having one N-channel MOS transistor (NMOS transistor) per memory cell.

In FIG. 17, memory cells MC0, MC1, MC2, and MC3 having NMOS transistors M0, M1, M2, and M3, respectively, are disposed in four portions at which two data lines DL0 and DL1 disposed in parallel and two word lines WL0 and WL1 disposed in parallel cross each other.

A gate electrode and drain electrode of the NMOS transistor M0 are connected to the word line WL0 and data line DL0. A gate electrode and drain electrode of the NMOS transistor M1 are connected to the word line WL0 and data line DL1. A gate electrode and drain electrode of the NMOS transistor M2 are connected to the word line WL1 and data line DL0. The gate electrode and drain electrode of the NMOS transistor M3 are connected to the word line WL1 and data line DL1.

A capacitor CS is connected between each source electrode and each ground potential of the NMOS transistors M0, M1, M2, and M3.

A sense amplifier SA is connected to the data lines DL0 and DL1, respectively. Connections and non-connections of one terminal of the data line DL0 and one terminal of the data line DL1 to a data input-output line IO are controlled by column selection switches CW0 and CW1. The sense amplifier SA has switches SW0 and SW1, the operations of which are controlled by a sense amplifier drive signal.

Connection and non-connection of the other terminal of the data line DL0 and the other terminal of the data line DL1 to a precharge voltage supply line PL are controlled by precharge switches PW0 and PW1. A capacity CD parasitizes the data lines DL0 and DL1.

Operation of the DRAM 90 will next be described by referring to FIG. 17.

Precharge Operation

In a DRAM, a precharge operation is performed prior to the operation of a memory cell. In the precharge operation, the data lines DL0 and DL1 are set to a predetermined precharge voltage VP, and the precharge voltage VP is generally a half of a write voltage VDD (VP=VDD/2).

Power consumption and noise when charging and discharging the data lines can be reduced by setting the precharge voltage VP to an intermediate value between the write voltage VDD to the capacitor and 0 V.

Turning on a precharge clock starts the precharge operation. Turning off the precharge clock results in that the precharge voltage VP is held in a floating state by a parasitic capacity CD of the data line.

Read Operation

Operation of reading the data of a specific memory cell, e.g., a memory cell M0, will be described below.

First, select the word line WL0 to which the memory cell M0 is connected, and apply a pulse voltage (word pulse). Thereby, a signal voltage VS that corresponds to an information voltage (VDD or 0 V) of the capacitor CS in the memory cell M0 is superimposed to the precharge voltage VP, and the resulting voltage is then outputted to the data line DL0, as a positive or negative signal. Note that the operation of outputting the capacitor information to the data line is hereinafter referred to as "data calling," in some cases. The signal voltage VS can be expressed in the following equation (1).

$$VS = VDD/2 \cdot CS/CS + CD \quad (1)$$

In general, the capacity of the capacitor CS is far smaller than the parasitic capacity CD. The modem trend in reducing the area of a semiconductor chip is toward smaller memory cell and connection between one data line and more memory cells. Therefore, there has been tendency toward further small capacitor CS and further large parasitic capacity CD.

The signal voltage VS that is a small positive or negative signal is detected and amplified by the sense amplifier SA connected to the data lines DL0 and DL1.

The sense amplifier SA operates by using the precharge voltage VP (VDD/2) as a reference voltage. If the signal voltage VS is greater than VDD/2, the output voltage of the sense amplifier SA becomes VDD. If smaller than VDD/2, it becomes 0.

The amplified voltage corresponding to the information of the capacitor CS is outputted to the exterior by turning on the column selection switches CW0 and CW1, thereby completing the read operation. At this time, information of every non-selected memory cell (hereat, the memory cell M1) on the selected word line (hereat, the word line WL0) is also called by the data line DL1, and the information is amplified by the sense amplifier SA.

When a word pulse is applied, information of every memory cell on the above word line is destroyed. Specifically, since the capacity of the capacitor CS is sufficiently smaller than the parasitic capacity CD, the storage node of the capacitor CS that has been VDD or 0 V is charged to the precharge voltage, irrespective of the information voltage.

More specifically, upon application of the word pulse, the storage node voltage corresponding to a binary information changes from VDD to (VDD/2)+VS, or from 0 V to (VDD/2)−VS. That is, the voltage margin of the binary information of the storage node decreases from VDD to 2VS, resulting in the same as the state that the information is destroyed.

This requires that an individual sense amplifier be placed on all the data lines and, with the sense amplifiers, the signal voltage VS be amplified to VDD or 0 V at the same time, and then rewritten to each memory cell.

Therefore, at the time of the read operation, a sequence of operations such as calling of a small signal voltage VS, amplifying, and rewriting, are performed in parallel with respect to all the memory cells on the selected word line. Only information of a data line, to which the selected memory cell is connected, is outputted to the exterior as a read information.

Write Operation

Write operation to the selected memory cell, e.g., the memory cell M0, is executed by applying a word pulse to the word line WL0 and a binary information voltage (VDD or 0 V) to the data line DL0.

However, as discussed above, the read operation is performed prior to the write operation, because it is necessary to prevent information destroy of the non-selected cell due to the application of the word pulse.

Specifically, the above-mentioned read operation is performed with respect to all the memory cells on the word line WL0, and the amplified voltage corresponding to the information of the memory cell is temporally held on the respective data lines.

Thereafter, the column selection switch CW0 is turned on so that the amplified voltage on the selected data line DL0 is forcedly replaced with a write information voltage from the exterior (the data input-output line IO). This is then inputted to the capacitor CS of the memory cell MC0 that has selected the write information voltage.

At this time, the amplified voltage of all the non-selected data lines (hereat, the data line DL1) on the selected word line (hereat, the word line WL0) is rewritten to the non-selected cell (hereat, the memory cell MC1).

Through the foregoing operations, irrespective of the read or write operation of the selected cell, a sequence of operations such as the calling of the small signal voltage VS, amplifying, and rewriting, is performed in the non-selected memory cell on the selected word line.

In order to output a sufficient signal voltage to a data line, or write the voltage VDD to the capacitor CS, the word pulse voltage is applied as a voltage not less than the sum of the voltage VDD and the threshold voltage $V_{th}$ of a cell transistor.

Refresh Operation

Refresh operation inherent in DRAMs can be realized by that the foregoing read operation is successively performed with respect to all the word lines.

That is, the refresh operation is performed by word line by word line, and all the memory cells on the word line are refreshed at the same time. Thereby, even if the voltage of the storage node of the capacitor CS in a memory cell is lowered due to current leak and the like, it can be refreshed to the initial value. By performing the above-mentioned refresh operation with respect to all the word lines, the information of all the memory cells are refreshed and thus the stored information of the semiconductor chip is held as a whole.

Overall Configuration of DRAM

FIG. 18 shows the overall configuration of a DRAM. That is, FIG. 18 is a schematic diagram of an exemplary plane configuration of a general DRAM. The memory cell part of the DRAM 90 described by referring to FIG. 17 is contained in a memory array block MAB.

A plurality of memory array blocks MAB are arranged in two columns. In a central part sandwiched therebetween, there is a power supply to form a central power supply CPW.

In the central power supply CPW, there are, for example, pads for connecting and grounding an external power supply, a voltage down converter VDC for lowering an external power supply voltage to an internal power supply voltage, and wiring for transferring the internal power supply voltage and ground voltage. In the memory array block MAB, there are, for example, a plurality of memory cells to form a memory array, as well as peripheral circuits such as a sense amplifier.

FIG. 19 schematically shows the configuration of the memory array block MAB in FIG. 18, in particular, the state that the memory array block MAB is formed by a plurality of memory arrays MA.

FIG. 20 shows the configuration of one memory array MA in the memory array block MAB.

Referring to FIG. 20, the memory cell array is formed by a plurality of memory cells MC spaced at predetermined intervals and in the form of a matrix. The memory cells MC in the direction of the same column are connected to a common bit line BL that is a data line. The bit line BL is connected to a sense amplifier SA. To one sense amplifier, two bit lines BL are connected to form a pair of bit lines.

A plurality of word lines WL are arranged so as to be orthogonal to a plurality of bit lines BL disposed in parallel. These word lines WL are connected in common to the memory cell MC in the direction of the same row.

FIG. 20 shows the memory cell MC as a contour of an active region of the MOS transistor. In FIG. 20, the bit lines BL are connected to source/drain layers of the MOS transistor, and word lines are shown as a gate electrode of the MOS transistor.

The sense amplifier SA uses, as a reference voltage, the voltage of one of two bit lines BL to be connected thereto.

Of the configuration of FIG. 20, the configuration of the surroundings of the sense amplifier SA will be described by referring to FIG. 21.

As shown in FIG. 21, the sense amplifier SA has a P-channel MOS transistor (PMOS transistor) P1 and NMOS transistor N1 connected in series, and a PMOS transistor P2 and NMOS transistor N2 connected in series. Gate electrodes of the PMOS transistor P1 and NMOS transistor N1 are connected in common to connection nodes of the PMOS transistor P2 and NMOS transistor N2. Gate electrodes of the PMOS transistor P2 and NMOS transistor N2 are connected in common to connection nodes of the PMOS transistor P1 and NMOS transistor N1.

Connection nodes of the PMOS transistor P1 and NMOS transistor N1 are connected to a bit line BL. Connection nodes of the PMOS transistor P2 and NMOS transistor N2 are connected to a bit line /BL.

The bit line BL and bit line /BL form one pair of bit lines. Connection and non-connection of the bit lines BL and /BL to data input-output lines IO and /IO are controlled by an NMOS transistor MSW that is controlled by a signal of a column selection line CSL.

Power supply wirings WR1 and WR2, and sense enable wirings SEp and SEn are disposed so as to be orthogonal to plural pairs of bit lines.

The power supply wiring WR1 is a wiring to which an internal voltage VDD is supplied, and is paired with the sense enable wiring SEp. Both are electrically connected with each other through a PMOS transistor MP1 that is a driver transistor.

The power supply wiring WR2 is a wiring to which a ground voltage GND is supplied, and is paired with the sense enable wiring SEn. Both are electrically connected with each other through an NMOS transistor MN1 that is a driver transistor.

Source electrodes of PMOS transistors P1 and P2 forming the sense amplifier SA are connected to the sense enable wiring SEp. Source electrodes of NMOS transistors N1 and N2 are connected to the sense enable wiring SEn.

In the foregoing configuration, every time sense amplifier drive signals /SAE and SAE are applied to the PMOS transistor MP1 and NMOS transistor MN1, the internal voltage VDD and ground voltage GND are applied to the source electrodes of the PMOS transistors P1 and P2 forming the sense amplifier SA, and to the source electrodes of the NMOS transistors N1 and N2. For the rest, these source electrodes are in the state of floating. This operation aims at lowering a standby current of the sense amplifier SA.

FIG. 22 is a schematic diagram of wiring for power supply to sense amplifiers SA on memory arrays MA.

As described with respect to FIG. 21, to the sense amplifiers SA, there are supplied the internal voltage VDD through the power supply wiring WR1 and sense enable wiring SEp, and the ground voltage GND through the power supply wiring WR2 and sense enable wiring SEn. As shown in FIG. 22, the voltages of the power supply wirings WR1 and WR2 are fixed through mesh power lines MPL1 and MPL2 that are connected to the central power supply CPW.

A plurality of power supply wirings are connected to an individual mesh power line. That is, the mesh power line MPL1 is a wiring for supplying the internal voltage VDD and is connected to the power supply wiring WR1 disposed in each memory array MA. The mesh power line MPL2 is a wiring for supplying the ground voltage GND and is connected to the power supply wiring WR2 disposed in each memory array MA.

A plurality of the mesh power lines MPL1 and MPL2 are arranged alternately. These mesh power lines MPL1 are connected to an output line OL1 of a voltage down converter VDC for pulling down an external power supply voltage Vdd to the internal voltage VDD. An external power supply voltage Vdd is fed from the exterior of the semiconductor chip through an external voltage pad PD2.

The plural mesh power lines MPL2 are connected to a ground line OL2 that is connected to a ground pad PD1.

Reference is now made to a timing chart in FIG. 23, and problems involved in reading data from a memory cell will be described by referring to FIG. 21.

FIG. 23 illustrates voltage fluctuations in the sense enable wirings SEp and SEn, and in the bit lines BL and /BL. Waveforms indicated by solid lines represent phenomena that are the problems, and waveforms indicated by broken lines represent ideal waveforms.

When applying the sense amplifier drive signals SAE and /SAE at the timing indicated by arrows in FIG. 23, the internal voltage VDD is supplied through the sense enable wiring SEp to the source electrodes of the PMOS transistors P1 and P2 forming the sense amplifier SA. And, the ground voltage GND is supplied through the sense enable wiring SEn to the source electrodes of the NMOS transistors N1 and N2.

At this time, ideally, the bit line BL rises sharply as shown by the broken line at the timing of receiving the sense amplifier signal SAE, and the bit line BL falls sharply at the time of receiving the sense amplifier drive signal /SAE.

However, when the plural sense amplifiers SA are turned on at the same time, as shown in FIG. 23, the potentials of the sense enable wirings SEp and SEn fluctuate by the amount of $\Delta$VDD and $\Delta$GND, respectively.

The reason for this is as follows. Since the plural sense amplifiers are connected to the sense enable wirings SEp and SEn, the wiring length is long and wiring capacity is large. Therefore, a voltage drop due to the wiring capacity is produced on the sense enable wiring SEp, and a voltage buildup is produced on the sense enable wiring SEn. Electronic current and hole current contributing to voltage fluctuations have the same time integral value according to conservation of charge.

Hence, fluctuations in the internal voltage VDD and ground voltage GND for driving the sense amplifiers degradates the drive capability of the transistors forming the sense amplifiers. This elongates a delay time tRCD between reading when a word pulse is applied to a word line and sensing and discrimination of the information of a bit line. As a result, there is the problem that the sense operations of the sense amplifiers become dull.

SUMMARY OF THE INVENTION

It is an object of the present invention to provide a semiconductor device capable of avoiding that the sense speed of each sense amplifier lowers due to drives of a plurality of sense amplifiers.

A semiconductor device according to a first aspect of the invention includes the following components of (i) to (v). Specifically, (i) is a main semiconductor layer of a first conductivity type being disposed entirely on a main surface of a semiconductor substrate and having above it plural wiring layers; (ii) is a first semiconductor layer of the first conductivity type selectively disposed in a first main surface of the main semiconductor layer; (iii) is a second semiconductor layer of the first conductivity type and a third semiconductor layer of a second conductivity type that are selectively disposed in the first main surface of the main semiconductor layer and are adjacent to the first semiconductor layer so as to sandwich therebetween the first semiconductor layer; (iv) is a fourth semiconductor layer of the second conductivity type selectively disposed in an inner part of the main semiconductor layer beneath the first semiconductor layer so that it makes contact with at least a bottom surface of the first semiconductor layer; and (v) is a fifth semiconductor layer of the first conductivity type disposed in a second main surface of the main semiconductor layer. The fifth semiconductor layer is disposed in such a thickness as to form a PN junction with the fourth semiconductor layer and has a junction capacitance between the fourth and fifth semiconductor layers. The plural wiring layers have a first power supply wiring to which a first voltage is supplied and a second power supply wiring to which a second voltage lower than the first voltage is supplied. The third semiconductor layer is electrically connected to the first power supply wiring, and the second semiconductor layer is electrically connected to the second power supply wiring.

The fifth semiconductor layer of the first conductivity type disposed entirely in a depth from the second main surface of the main semiconductor layer is located at such a thickness as to form a PN junction with the fourth semiconductor layer. Therefore, a junction capacitance is present between the fourth and fifth semiconductor layers. When a voltage drop due to the parasitic capacity is produced on the first power supply wiring, charge can be supplied from the junction capacitance to the first power supply wiring through the third and fourth semiconductor layers. As a result, the voltage of the first power supply wiring is maintained at a fixed value. In addition, by making the fifth semiconductor layer have such a thickness as to form a PN junction with the fourth semiconductor layer, the distance between the fifth and second semiconductor layers can be reduced to lower the resistance value of the second semiconductor layer. When a voltage buildup due to the parasitic capacity is produced an the second power supply wiring, it is easy to reduce charge from the second power supply wiring through the second semiconductor layer. As a result, the voltage of the second power supply wiring is maintained at a fixed value.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a timing chart illustrating the operation of the semiconductor device;

FIGS. 13 and 14 are sectional views showing the configuration for fixing the potential of a P-type well layer of the semiconductor device;

FIG. 15 is a diagram showing the circuit configuration of a semiconductor device according to a second preferred embodiment of the invention;

DESCRIPTION OF THE PREFERRED EMBODIMENTS

A. First Preferred Embodiment

A-1. Device Configuration

Figure 1:
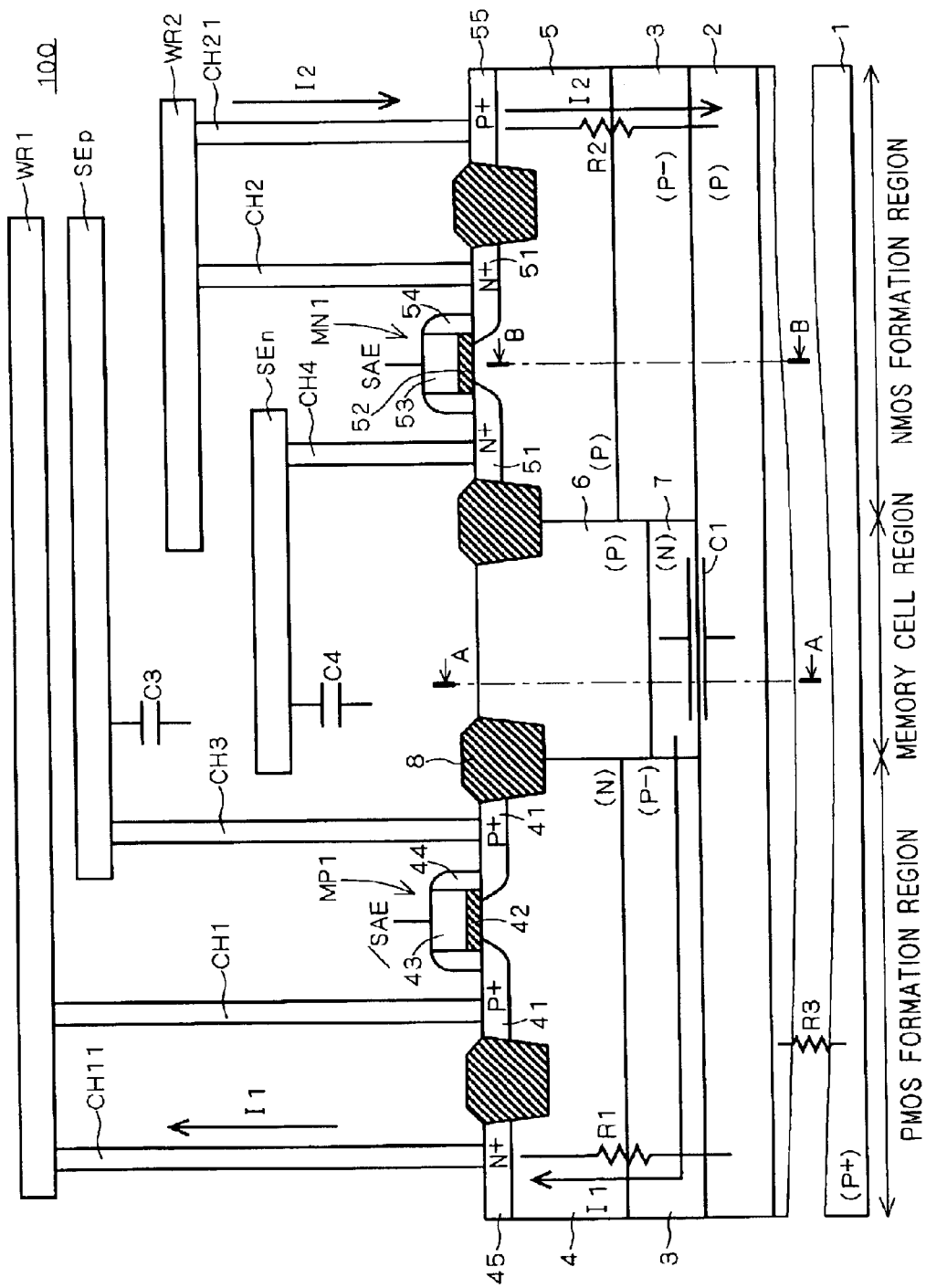
FIG. 1 is a sectional view showing the configuration of a characteristic part of a semiconductor device according to a first preferred embodiment of the invention.

FIG. 1 shows a sectional configuration of a characteristic part of a DRAM 100, as a semiconductor device according to a first preferred embodiment of the invention.

Referring to FIG. 1, in the DRAM 100, a P-type well layer 2 containing a P-type impurity is disposed entirely on a main surface of a semiconductor substrate 1 (e.g., a silicon substrate) containing a P-type impurity at a relatively high concentration ($P^+$). Disposed on the P-type well layer 2 is an epitaxial layer 3 containing a P-type impurity at a relatively low concentration ($P^-$).

A P-type well layer 6 containing a P-type impurity is selectively disposed in a main surface of the epitaxial layer 3, and an N-type bottom layer 7 containing an N-type impurity is disposed so as to make contact with a bottom surface of the P-type well layer 6. The P-type well layer 2 is disposed in such a thickness as to make contact with the N-type bottom layer 7, so that the N-type bottom layer 7 and P-type well layer 2 form a PN junction.

Further, in the main surface of the epitaxial layer 3, an N-type well layer 4 containing an N-type impurity, and a P-type well layer 5 containing a P-type impurity are selectively disposed so as to sandwich therebetween the P-type well layer 6.

The area occupied by the epitaxial layer 3 is drawn to a small scale in FIG. 1. In fact, the semiconductor substrate 1 and the epitaxial layer 3 having a thickness of about 6 $\mu$m form an epitaxial substrate. The P-type well layer 2 is disposed in the main surface of the epitaxial layer 3, together with the N-type well layer 4 and P-type well layers 5 and 6.

In main surfaces of the N-type well layer 4 and P-type well layer 5, an isolation insulating film 8 that is called "STI (shallow trench isolation)" is selectively disposed to define a region for forming a MOS transistor.

The isolation insulating film 8 also defines the region of the P-type well layer 6, which is referred to as "memory cell region" because a memory cell is disposed therein.

The P-type well layer 2 is formed, for example, by making a P-type impurity, such as boron (B), thermally diffuse from the semiconductor substrate 1 containing the P-type impurity at a relatively high concentration, in a high temperature heat treatment for forming the isolation insulating film 8.

A pair of source/drain layers 41 containing a P-type impurity at a relatively high concentration are disposed in a region defined by the isolation insulating film 8 in the N-type well layer 4. A gate insulating film 42 is disposed on opposed end portions of the paired source/drain layers 41 and on the N-type well layer 4 locating between the source/drain layers 41. A gate electrode 43 overlies the gate insulating film 42. A sidewall insulating film 44 is disposed on the side surfaces of the gate insulating film 42 and gate electrode 43, resulting in a PMOS transistor MP1. A sense amplifier drive signal /SAE is applied to the gate electrode 43 of the PMOS transistor MP1.

A pair of source/drain layers 51 containing an N-type impurity at a relatively high concentration ($N^+$) are disposed in a region defined by the isolation insulating film 8 in the P-type well layer 5. A gate insulating film 52 is disposed on opposed end portions of the paired source/drain layers 51 and on the P-type well layer 5 locating between the paired source/drain layers 51. A gate electrode 53 overlies the gate insulating film 52. A sidewall insulating film 54 is disposed on the side surfaces of the gate insulating film 52 and gate electrode 53, resulting in an NMOS transistor MN1. A sense amplifier drive signal SAE is applied to the gate electrode 53 of the NMOS transistor MN1.

Hereinafter, the region where the PMOS transistor MP1 is formed is referred to as "PMOS formation region," at which a PMOS transistor forming the peripheral circuit of a memory cell is formed. The region where the NMOS transistor MN1 is formed is referred to as "NMOS formation region," at which an NMOS transistor forming the peripheral circuit of a memory cell is formed.

There is an interlayer insulating film (not shown) is disposed so as to cover above the semiconductor substrate 1, as well as above the PMOS transistor MP1 and NMOS transistor MN1.

That is, one of the paired source/drain layers 41 is electrically connected to a power supply wiring WR1 through a contact hole CH1 disposed in the interlayer insulating film, and the other is electrically connected to a sense enable wiring SEp through a contact hole CH3 disposed in the interlayer insulating film.

One of the paired source/drain layers 51 is electrically connected to a power supply wiring WR2 through a contact hole CH2 disposed in the interlayer insulating film, and the other is electrically connected to a sense enable wiring SEn through a contact hole CH4 disposed in the interlayer insulating film.

An N-type impurity layer 45 containing an N-type impurity at a relatively high concentration is selectively disposed in the N-type well layer 4. The power supply wiring WR1 is also electrically connected to the N-type impurity layer 45 through a contact hole CH11.

Likewise, a P-type impurity layer 55 containing a P-type impurity at a relatively high concentration is selectively disposed in the P-type well layer 5. The power supply wiring WR2 is also electrically connected to the P-type impurity layer 55 through a contact hole CH21.

In FIG. 1, a variety of capacitance components and resistance components are schematically illustrated. Specifically, reference character C1 indicates the junction capacitance between the P-type well layer 2 and N-type bottom layer 7, C3 indicates the wiring parasitic capacity of the sense enable wiring SEp, C4 indicates the wiring parasitic capacity of the sense enable wiring SEn, R1 indicates the resistance of the N-type well layer 4, R2 indicates the resistance of the P-type well layer 5, and R3 indicates the resistance of the semiconductor substrate 1. The N-type bottom layer 7 extends from a portion thereof (not shown), which locates in the vertical direction as viewed in FIG. 1, to a lower part of an N-type well layer formed in the surface of the epitaxial layer 3. Through this N-type well layer, the n-type bottom layer 7 is connected to the internal voltage VDD. Therefore, the junction capacitance C1 can store charge that corresponds to the internal voltage VDD.

Figure 2:
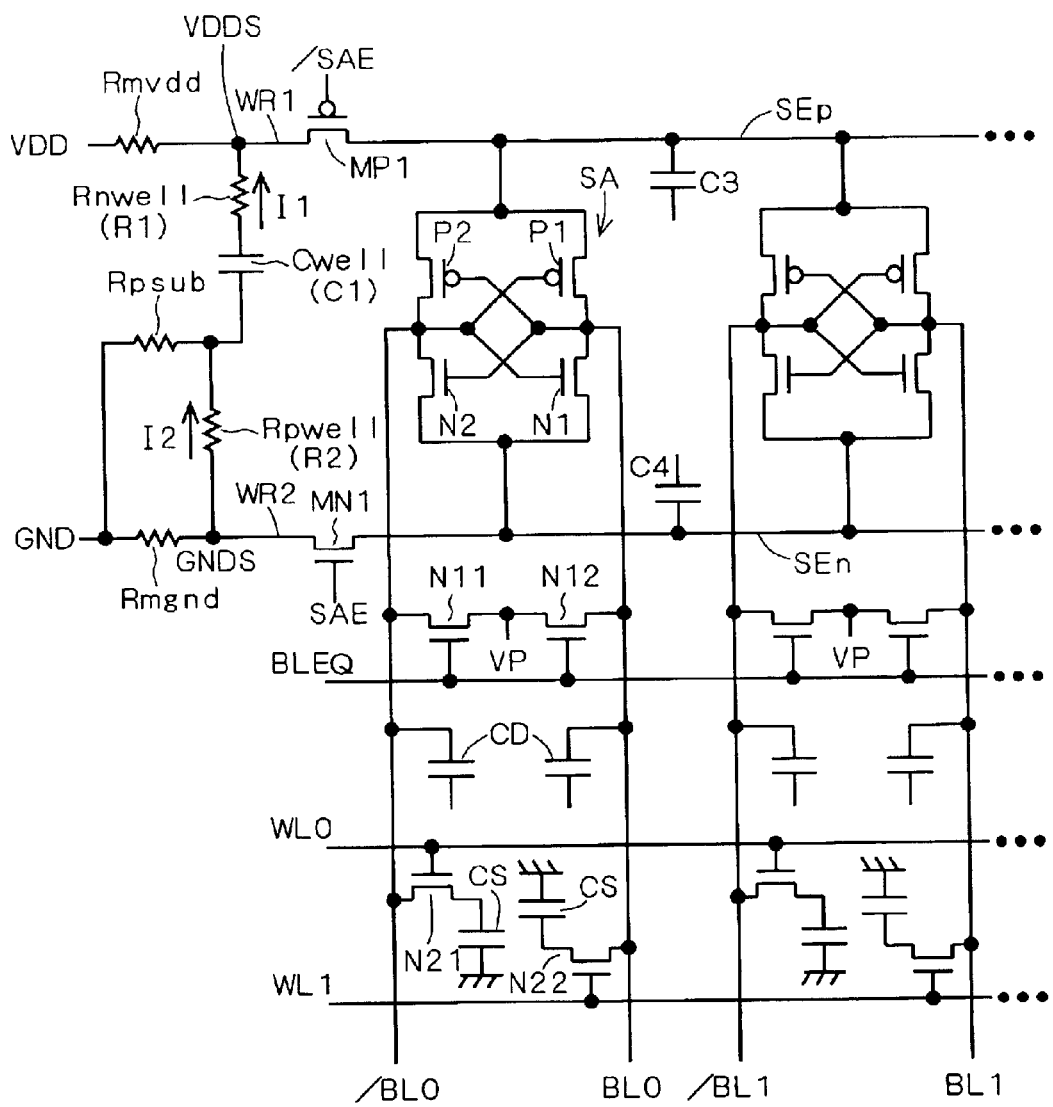
FIG. 2 is a diagram showing the circuit configuration of the semiconductor device.
Figure 21:
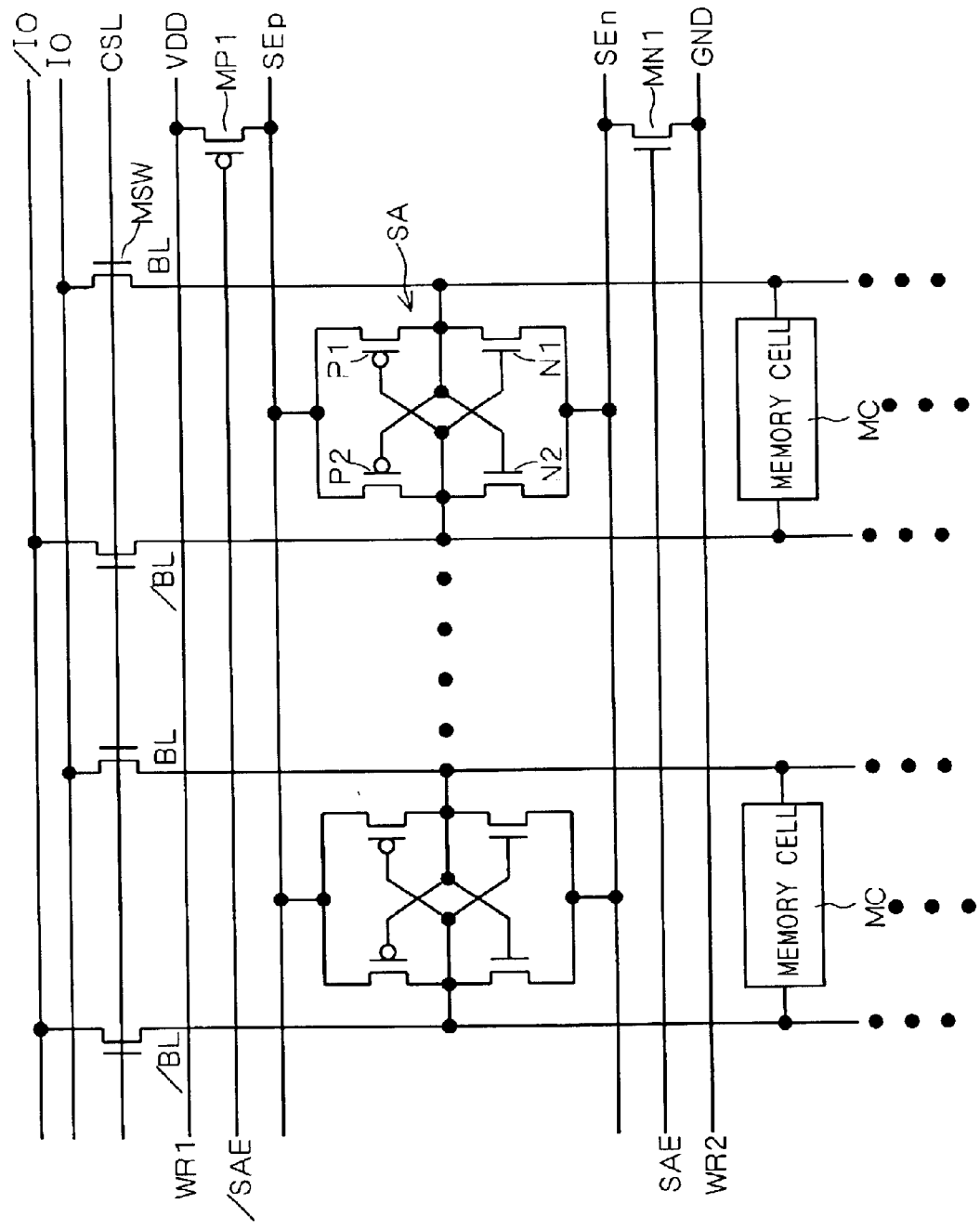
FIG. 21 is a diagram showing the peripheral configuration of sense amplifiers of the general DRAM.

Reference is next made to FIG. 2 for understanding of the electrically connection relationship between a sense amplifier of the DRAM 100 and its peripheral configuration. An equivalent circuit shown in FIG. 2 is basically the same as that of FIG. 21.

As shown in FIG. 2, a sense amplifier SA has a PMOS transistor P1 and NMOS transistor N1 connected in series, and a PMOS transistor P2 and NMOS transistor N2 connected in series. Gate electrodes of the PMOS transistor P1 and NMOS transistor N1 are connected in common to connection nodes of the PMOS transistor P2 and NMOS transistor N2. Gate electrodes of the PMOS transistor P2 and NMOS transistor N2 are connected in common to connection nodes of the PMOS transistor P1 and NMOS transistor N1.

The connection nodes of the PMOS transistor P1 and NMOS transistor N1 are connected to a bit line BL0, and connection nodes of the PMOS transistor P2 and NMOS transistor N2 are connected to a bit line /BL0.

Bit line BL0 and bit line /BL0 form one pair of bit lines. Drain electrodes of NMOS transistors N21 and N22 are connected to the bit lines /BL0 and BL0, respectively, and a capacitor CS is connected between each source electrode and ground potential of the NMOS transistor N21 and N22, resulting in a memory cell.

Gate electrodes of the NMOS transistors N21 and N22 are connected to word lines WL0 and WL1, respectively. A capacity CD parasitizes the bit lines BL0 and /BL0.

Between the bit lines BL0 and /BL0, NMOS transistors N11 and N12 connected in series are disposed such that a precharge voltage VP is applied to the connection node of these transistors. Gate electrodes of the NMOS transistors N11 and N12 are connected to an active signal line BLEQ that activates the bit lines.

The bit lines BL0 and /BL0 are each connected to data input-output lines, which are not shown.

The foregoing configuration is provided in each of a plurality of sense amplifiers SA, however, FIG. 2 shows only the configuration related to bit lines BL1 and /BL1 adjacent to the bit lines BL0 and /BL0.

Source electrodes of the PMOS transistors P1 and P2 forming the sense amplifier SA are connected to a sense enable wiring SEp, and source electrodes of the NMOS transistors N1 and N2 are connected to a sense enable wiring SEn.

The sense enable wiring SEp is connected to the drain electrode of the PMOS transistor MP1 such that it can be electrically connected or non-connected to a power supply wiring WR1, which is connected to a source electrode of a PMOS transistor MP1 and is provided with an internal voltage VDD.

The sense enable wiring SEn is connected to a drain electrode of the NMOS transistor MN1 such that it can be electrically connected or non-connected to a power supply wiring WR2, which is connected to a source electrode of the NMOS transistor MN1 and is provided with an internal voltage VDD.

Sense amplifier drive signals /SAE and SAE are applied to gate electrodes of the PMOS transistor MP1 and NMOS transistor MN1, respectively.

The power supply wirings WR1 and WR2 are metal wirings. As described with respect to FIG. 22, the power supply wiring WR1 is provided with an internal voltage VDD that is produced by voltage conversion in the voltage down converter VDC disposed in the central power supply CPW. The fact is that a voltage drop is produced by the presence of the a wiring resistance $R_{mvdd}$ of the power supply wiring WR1, and thus a voltage VDDS lower than the internal voltage VDD is applied to the sense amplifier.

Hereat, the following problem occurs. A wiring parasitic capacity C3 is present on the sense enable wiring SEp. Therefore, by turning on the PMOS transistor MP1, the capacity C3 is added to the power supply wiring WR1 through the PMOS transistor MP1. It follows that charge is stored in the wiring parasitic capacity C3, and the voltage VDDS is lowered.

Figure 22:
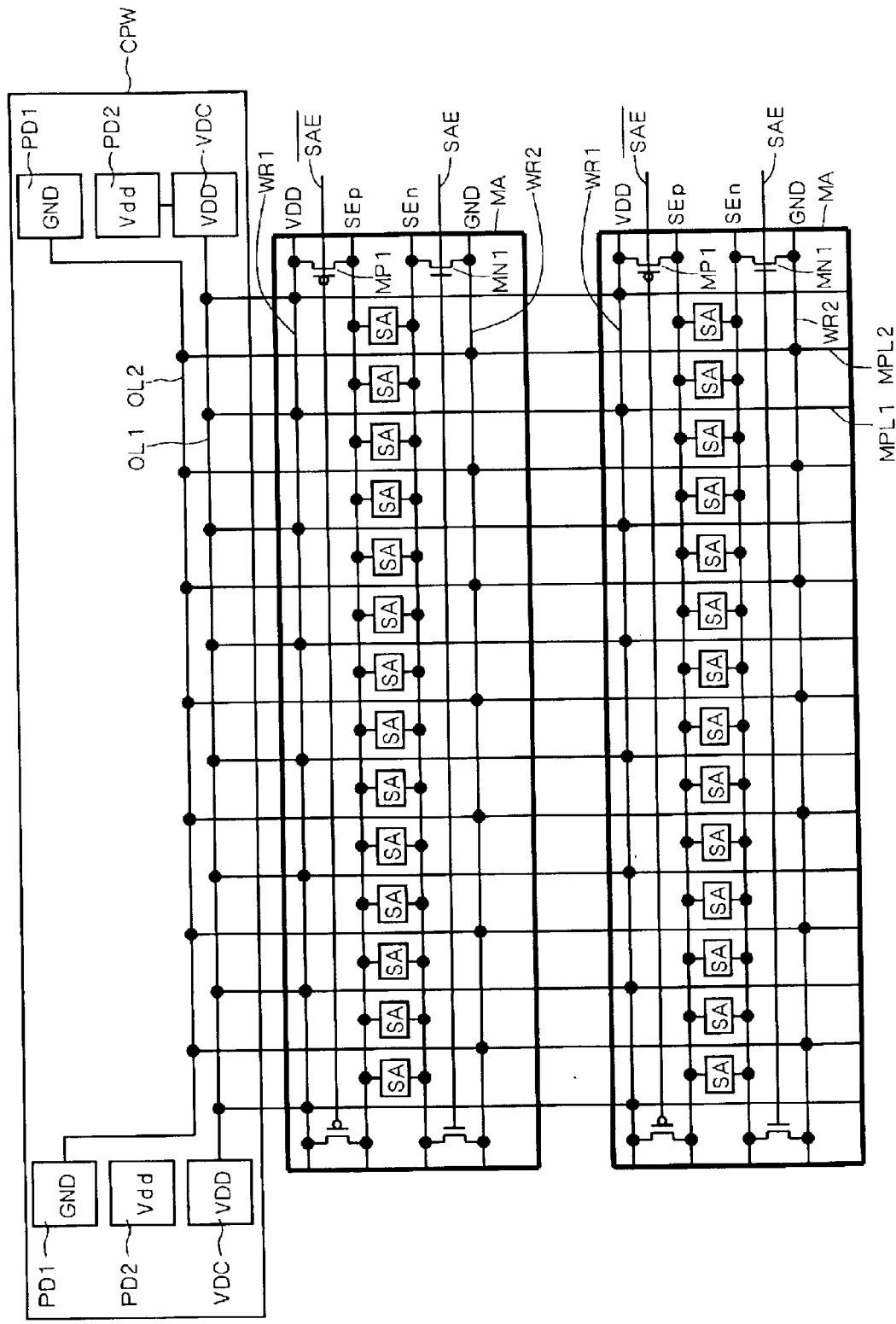
FIG. 22 is a diagram illustrating wiring for power supply to the sense amplifiers of the general DRAM.
Figure 23:
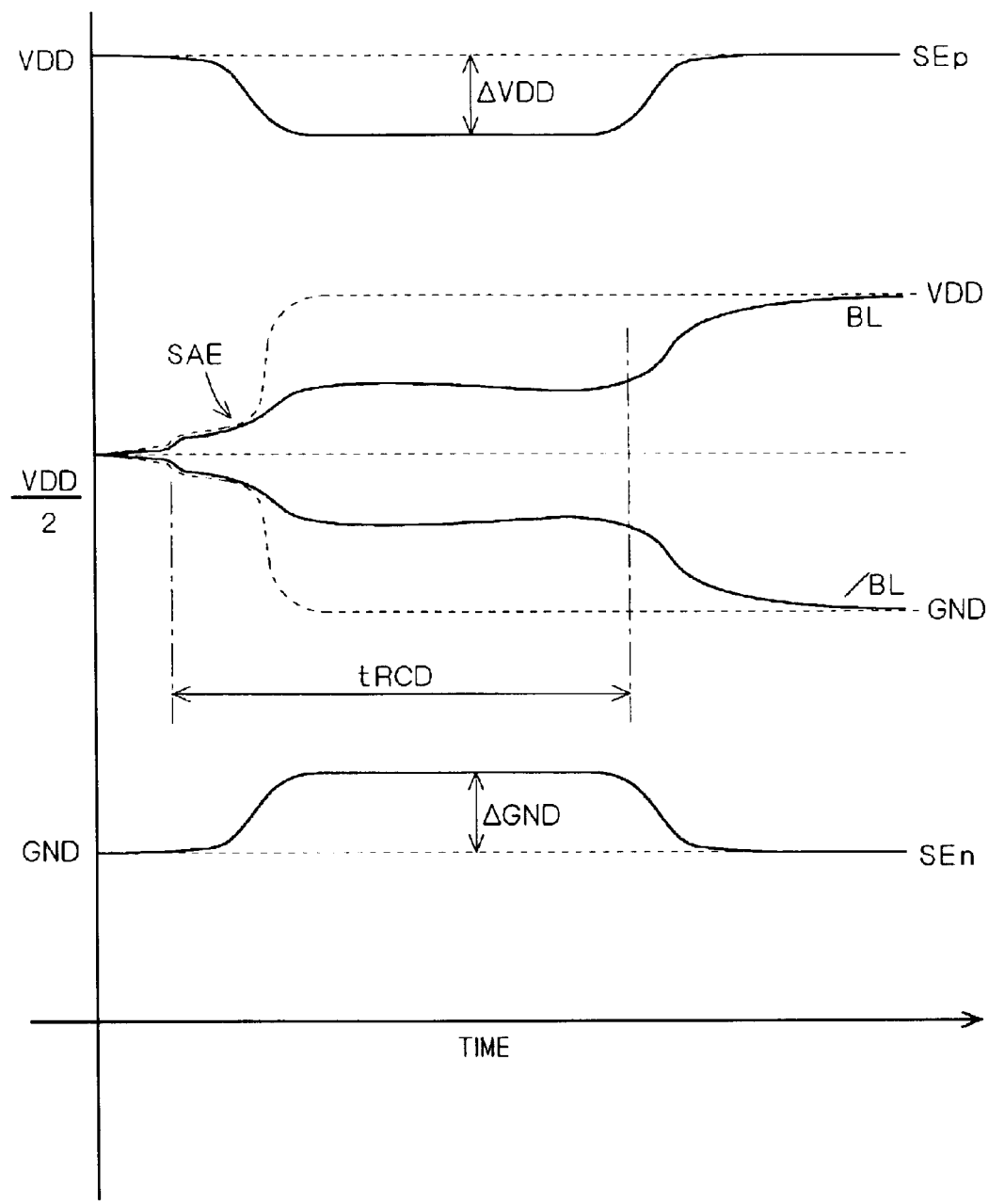
FIG. 23 is a diagram illustrating the operation of the general DRAM.

To the power supply wiring WR2, the ground voltage GND is supplied from the ground pad PD disposed in the central power supply CPW, as described with respect to FIG. 22. However, the wiring parasitic capacity C4 is present on the sense enable wiring SEn. Therefore, by turning on the NMOS transistor MN1, the wiring parasitic capacity C4 is added to the power supply wiring WR2 through the NMOS transistor MN1. It follows that the charge stored in the wiring parasitic capacity C4 is applied to the power supply wiring WR2, thereby increasing the ground voltage GND. The voltage thus fluctuates is to be applied to the sense amplifier as a voltage GNDS.

This fluctuations of the voltage VDDS and voltage GNDS for driving the sense amplifier degrades the drive capability of transistors and thus elongates a delay time tRCD between reading when a word pulse is applied to a word line and sensing and discrimination of the information of a bit line.

To avoid this, the present inventors came up with the idea of positively using the junction capacitance C1 between the P-type well layer 2 and N-type bottom layer 7.

Here, attention is drawn to the charging and discharging paths to the sense amplifier SA in FIG. 2. Between the power supply wiring WR1 and ground voltage GND, there are a resistance R1 (Rnwell) of the N-type well layer 4, the junction capacitance C1 (Cwell) between the P-type well layer 2 and N-type bottom layer 7, and a resistance R3 (Rpsub) of the semiconductor substrate 1. Between the power supply wirings WR1 and WR2, there are the resistance R1 of the N-type well layer 4, the junction capacitance C1 between the P-type well layer 2 and N-type bottom layer 7, and a resistance R2 (Rpwell) of the P-type well layer 5.

This configuration draws the following technical idea. That is, with the charge stored in the junction capacitance C1, the internal voltage VDD can be applied to the sense amplifier SA, and the ground voltage GND can be applied to the sense amplifier SA through the semiconductor substrate 1 and P-type well layer 5.

More specifically, increasing the junction capacitance C1 (Cwell) suppresses the fluctuations of the voltage VDDS to be applied to the sense amplifier SA. Also, decreasing the resistance R2 (Rpwell) of the P-type well layer 5 suppresses fluctuations of the voltage GNDS to be applied to the sense amplifier SA.

The operation of the DRAM 100 will be described while proceeding explanation of the reason that the delay time tRCD is reduced by decreasing the resistance R2 of the P-type well layer 5 and increasing, the junction capacitance C1 between the P-type well layer 2 and N-type bottom layer 7.

A-2. Device Operation

FIG. 3 shows a timing chart of an individual operation of a RAS (row address strobe) in the DRAM 100.

In FIG. 3, there are shown a signal of an active signal line BLEQ that activates a bit line, a signal of a word line WL1, sense amplifier drive signals SAE and /SAE, and signals applied to bit lines BL and /BL.

When the signal BLEQ of the active signal line BLEQ becomes Low (GND) and then a word pulse (VWP: Internal voltage VDD+Cell transistor threshold voltage $V_{th}$) is applied to the word line WL1, it is brought into High. The information of the capacitor CS of a memory cell is superimposed through an NMOS transistor N21 on the bit line BL that is triggered by the rise of the word line WL1 and then charged to a predetermined precharge voltage VP (VDDS/2). Accordingly, a small potential difference is produced between the bit lines BL and /BL.

Then, the sense amplifier drive signal SAE becomes High (VDD), which triggers the sense amplifier to drive. Therefore, the small potential difference between the paired bit lines is amplified by the amplification operation of the sense amplifier. As a result, the potential of the bit line BL becomes High (VDDS) and the potential of the bit line /BL becomes Low (GNDS).

Subsequently, a rise at which the signal of the active signal line BLEG becomes High (VDD) triggers the bit lines BL and /BL to be recharged to a precharge voltage VP.

Figure 4:
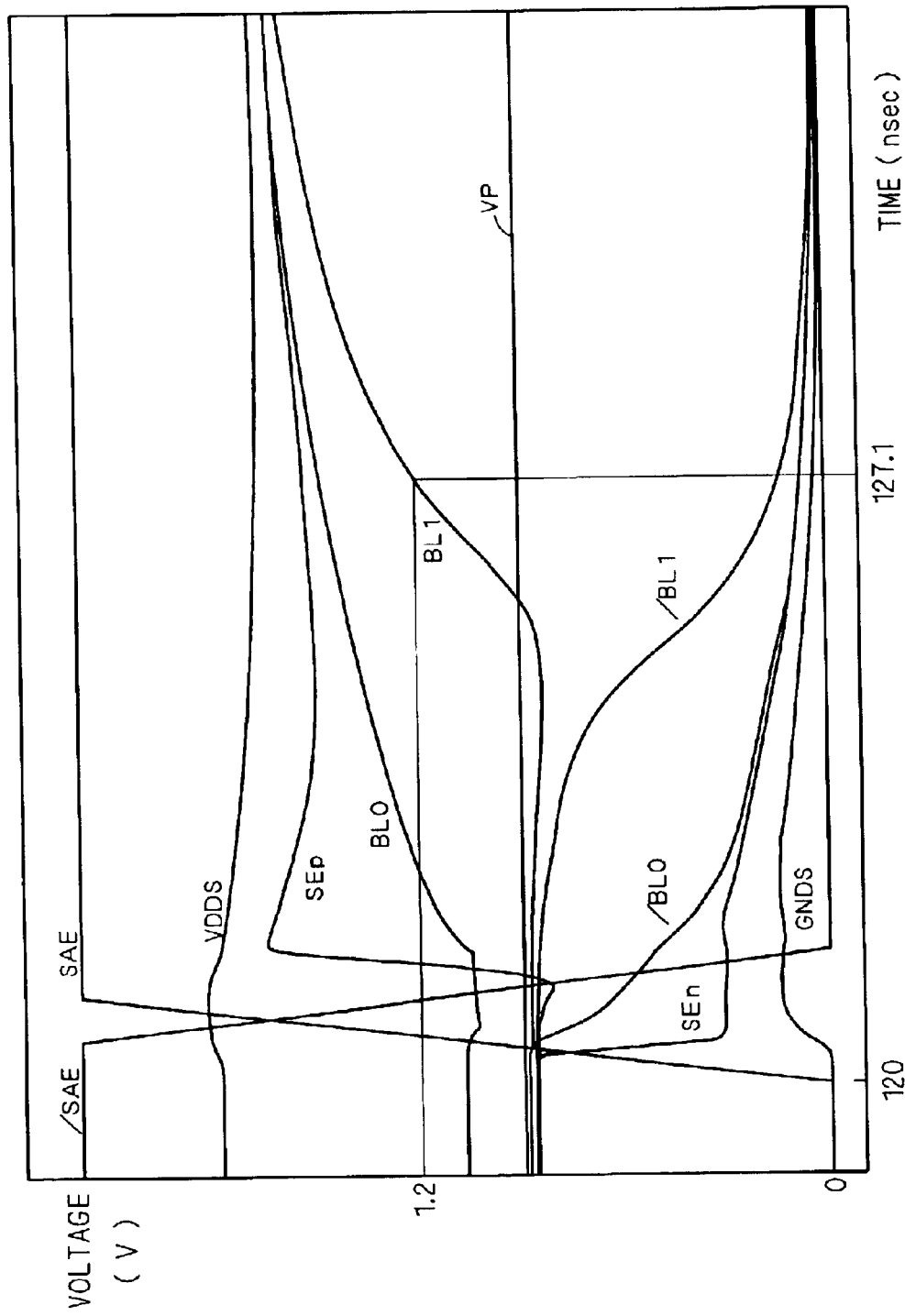
FIGS. 4 to 6 are diagrams showing the results of operation simulations of the semiconductor device.
Figure 5:
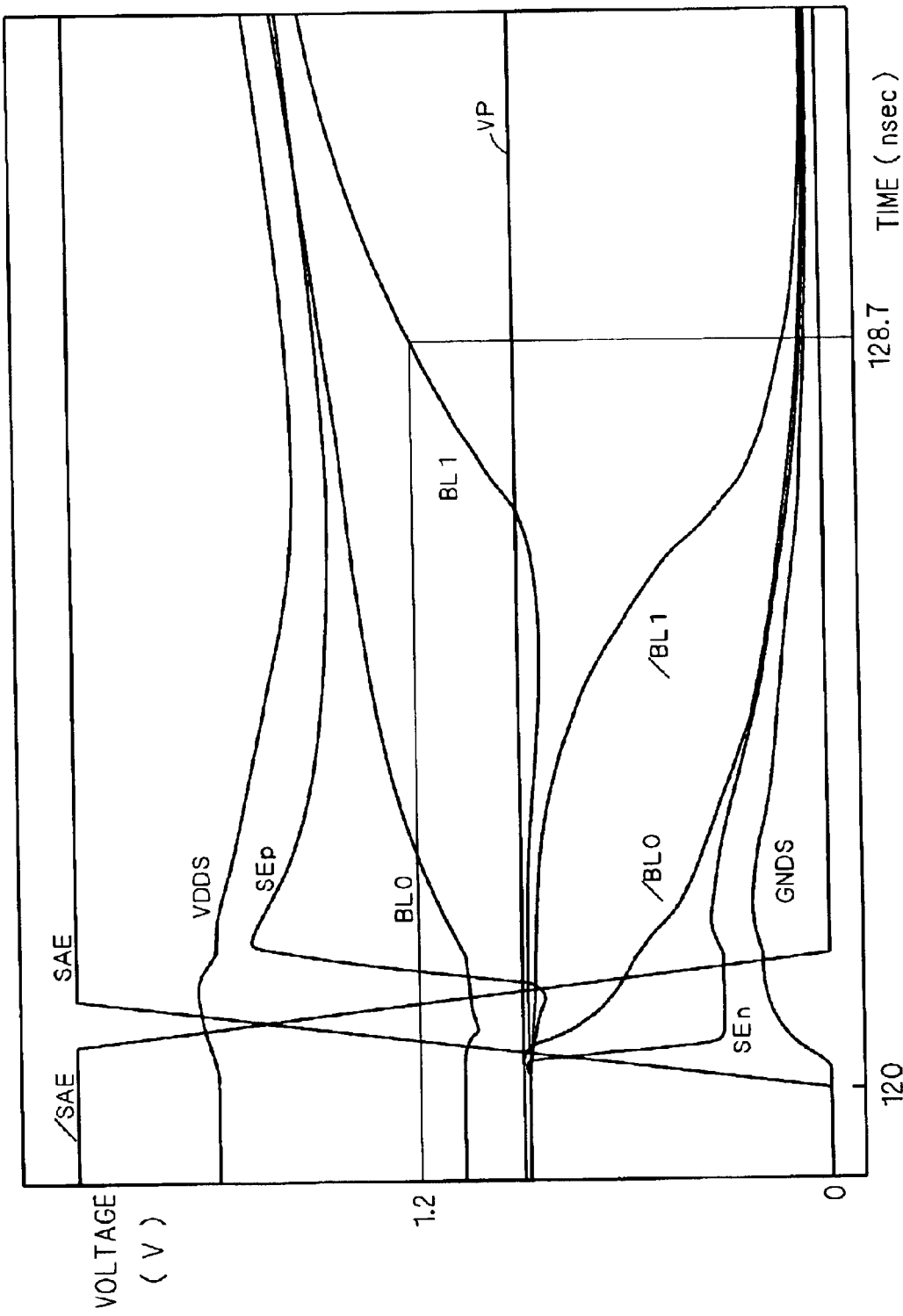

FIG. 4 shows a timing chart that is the result of a circuit simulation, assuming that there are twice as much the junction capacitance C1 and half as much as the resistance R2 under the condition that the product of the resistance R2 of the P-type well layer 5 and the junction capacitance C1 is constant, as shown in FIGS. 1 and 2. FIG. 5 shows a timing chart that is the result of a circuit simulation, assuming that there is half as much the junction capacitance C1 and twice as much the resistance R2 under the condition mentioned above.

The fluctuations of the sense amplifier drive signals SAE and /SAE, fluctuations of the voltages VDDS and GNDS to be applied to the sense amplifier, voltage fluctuations of the bit lines BL0 and /BL0, voltage fluctuations of the bit lines BL1 and /BL1, voltage fluctuations of the sense enable wirings SEp and SEn, and the precharge voltage VP, are summarized in FIGS. 4 and 5, on which the abscissa represents time (nsec) and the ordinate represents voltage (V).

Referring to FIGS. 4 and 5, consider now a period of time from the point that the sense amplifier starts driving upon receipt of the sense amplifier drive signals SAE and /SAE (120 nsec) to the point that the bit line BL1 reaches a voltage 1.2 V at which bit discrimination is possible. That is approximately 7.1 nsec in FIG. 4, and approximately 8.7 nsec in FIG. 5.

This shows that FIG. 4, in which there are four times as much the junction capacitance C1 and one fourth as much the resistance R2, has a shorter sense read time than in FIG. 5.

This also shows that after the sense amplifier drive signal SAE becomes High, FIG. 4 presents less potential drop of the voltage VDDS and less potential buildup of the voltage GNDS than FIG. 5. This means that by increasing the junction capacitance C1 and decreasing the resistance R2, fluctuations of the voltage VDDS and the voltage GNDS can be suppressed to maintain a fixed value.

And it is for this reason that the timing chart of FIG. 4 takes less time required to make possible bit discrimination, that is, less delay time tRCD between reading when a word pulse is applied to a word line and sensing and discrimination of the information of a bit line.

Figure 6:
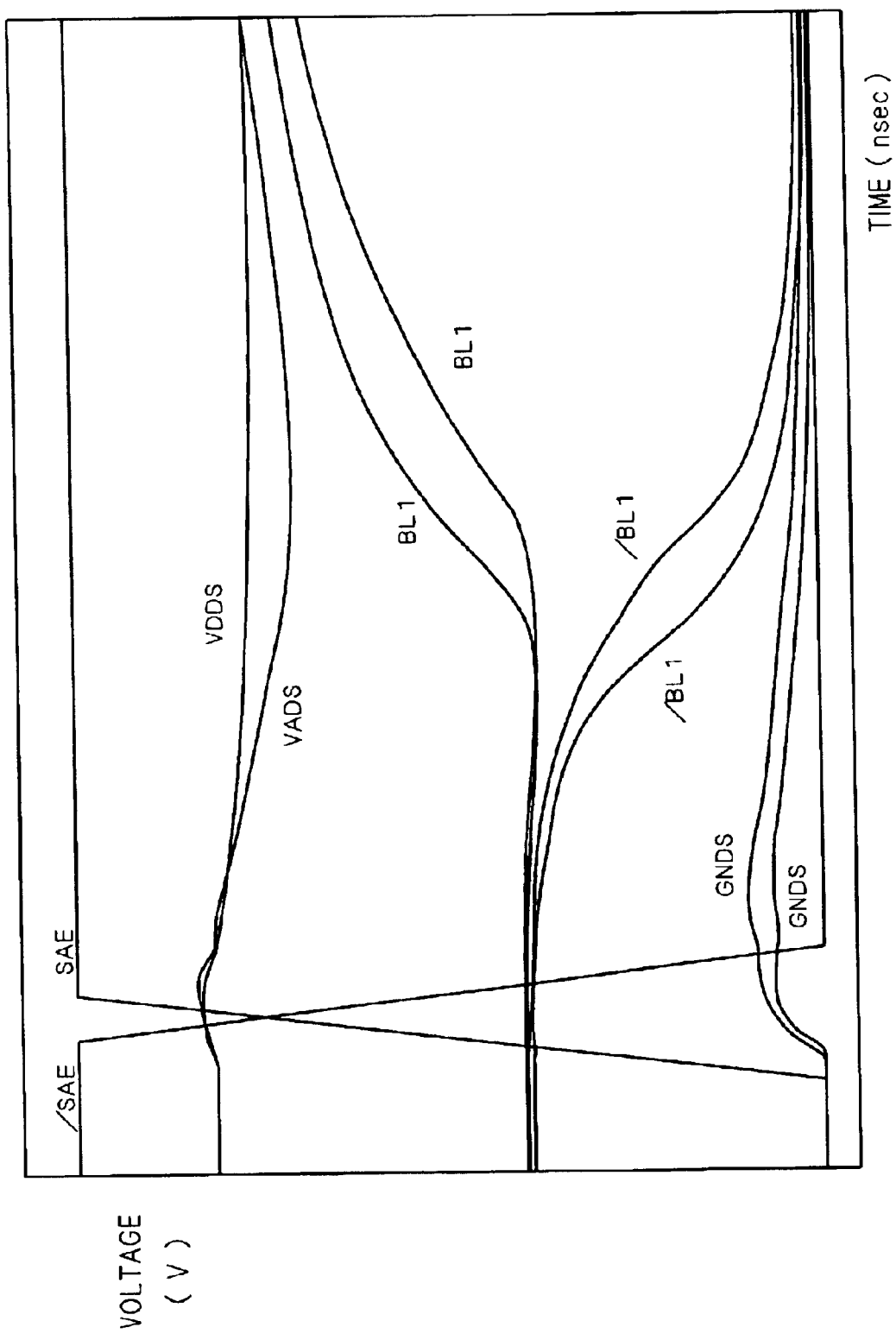

FIG. 6 summarizes the fluctuations of the sense amplifier drive signal SAE, voltage fluctuations of the bit lines BL1 and /BL1, and fluctuations in the voltages VDDS and GNDS in FIGS. 4 and 5.

A-3. Manufacturing Method

As stated above, the delay time tRCD can be reduced by decreasing the resistance R2 of the P-type well layer 5 and increasing the junction capacitance C1 between the P-type well layer 2 and N-type bottom layer 7. Exemplary techniques of increasing the junction capacitance C1 and decreasing the resistance R2 will be described below.

Figure 7:
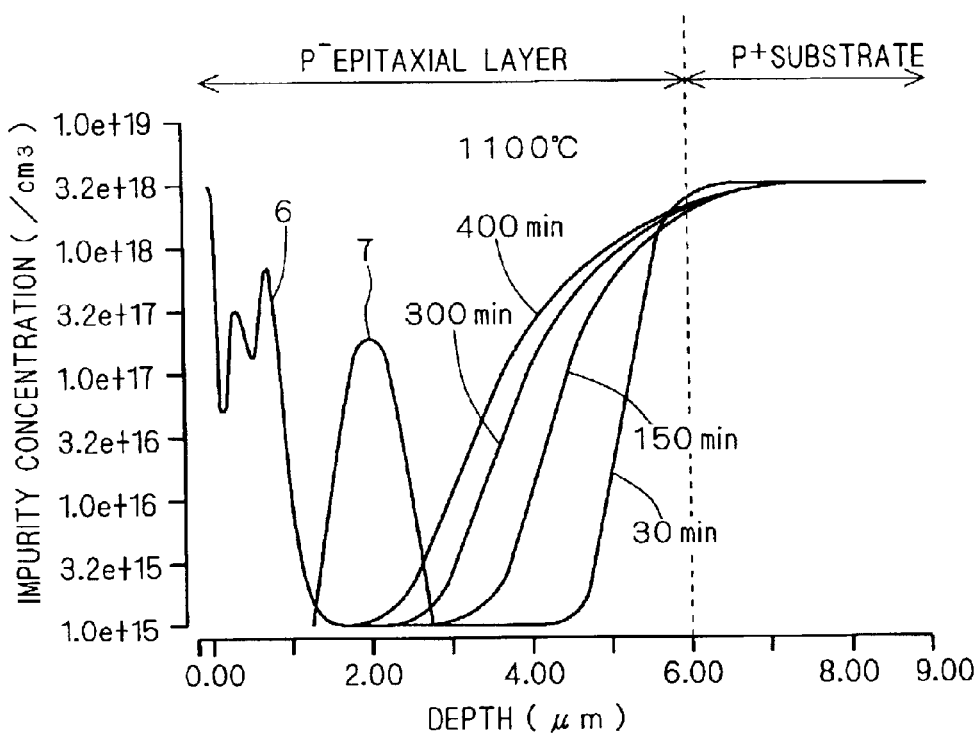
FIGS. 7 and 8 are diagrams showing the results of impurity distribution simulations of the semiconductor device.
Figure 8:
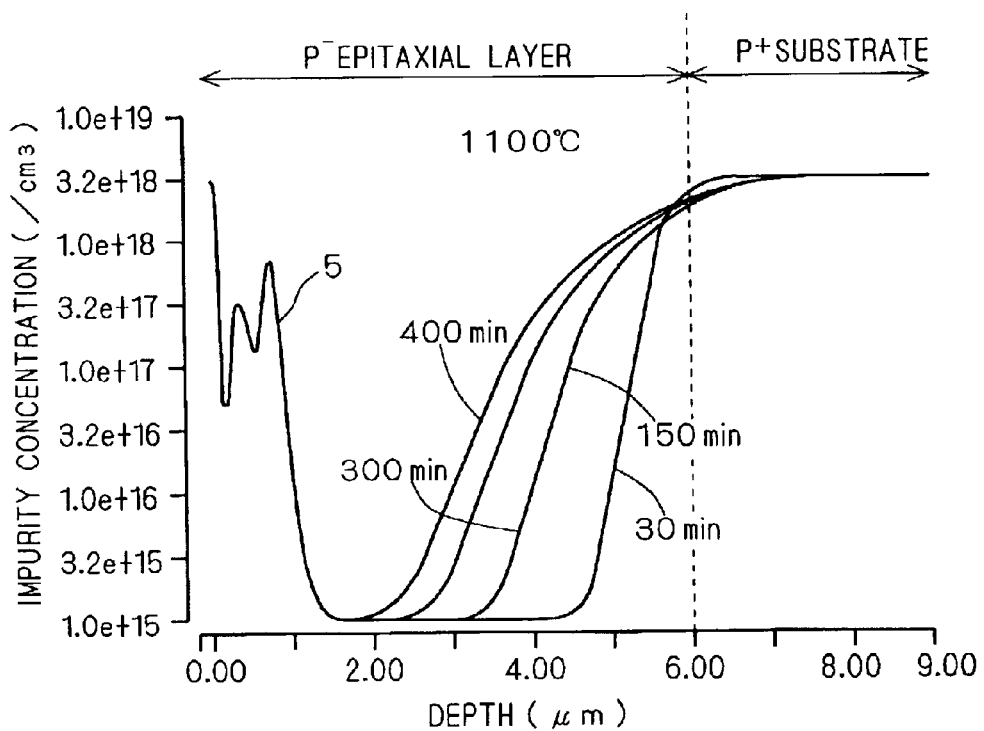

In FIGS. 7 and 8, on which the abscissa represents depth ($\mu$m) and the ordinate represents impurity concentration (/cm$^3$), there are shown the simulation results of impurity concentration distributions (hereat, boron is used as the impurity) in the direction of the substrate depth of the P-type well layer 2, when the temperature of heat treatment is fixed and heat treatment time is changed.

Specifically, FIGS. 7 and 8 show the impurity concentration distributions of the P-type well layer 2 when the heat treatment temperature is 1100° C., which is the heat treatment temperature for forming, for example, an STI (isolation insulating film 8), and the heat treatment time is 30 minutes, 150 minutes, 300 minutes, or 400 minutes.

More specifically, FIG. 7 shows the impurity concentration distribution in the cross section taken along the line A—A in FIG. 1, also shows the impurity concentration distribution to the N-type bottom layer, together with the impurity concentration distribution of the P-type well layer 2 as described above. From FIG. 7, it is found that the junction concentration between the P-type well layer 2 and N-type bottom layer 7 increases with increasing the heat treatment time. The distribution of thermally diffused boron forms a junction with the N-type bottom layer 7, resulting in the junction capacitance C1.

Referring to FIG. 7, when the heat treatment time is 150 minutes, the junction concentration between the P-type well layer 2, which is formed by that the boron in the semiconductor substrate 1 is thermally diffused to the epitaxial layer 3, and the N-type bottom layer 7, is slightly higher than 1×10$^{15}$/cm$^3$ that is the impurity concentration of the epitaxial layer 4. On the other hand, when the heat treatment time is 400 minutes, that is approximately 3.5×10$^{15}$/cm$^3$.

The thickness of the P-type well layer 2 is expressed in the following equation: L2−L1, wherein L1 is a depth at which the P-type well layer 2 and epitaxial layer 3 coexist, and L2 is a depth at which the P-type well layer 2 and semiconductor substrate 1 coexist. For example, the followings can be read off from FIG. 7. When the heat treatment time is 300 minutes, L1 is 2.3 $\mu$m and L2 is 6 $\mu$m, and thus the thickness of the P-type well layer 2 is 3.7 $\mu$m. When the heat treatment time is 400 minutes, L1 is 1.8 μm and L2 is 6 μm, and thus the thickness of the P-type well layer 2 is 4.2 μm.

Although in the foregoing, the impurity concentration of the epitaxial layer 4 is $1\times10^{15}/cm^3$, instead of being restricted to this, it may range from $1\times10^{15}$ to $1\times10^{16}/cm^3$. Also, although in the foregoing, the thickness of the epitaxial layer 4 is 6 μm, instead of being restricted to this, it may range from 1 to 10 μm.

In FIG. 7, there is shown, as example, the case that a junction between the P-type well layer 2 and N-type bottom layer 7 is reliably obtained when the heat treatment time is 300 minutes or 400 minutes. However, depending on the heat treatment temperature and the thickness of the N-type bottom layer 7, even a 150-minute heat treatment provides a junction between the P-type well layer 2 and N-type bottom layer 7 in some cases. Therefore, it can be considered that a further short heat treatment time provides a junction therebetween. Even when the heat treatment time is 150 minutes, in portions at which the profile of the N-type bottom layer 7 and the profile of the P-type well layer 2 cross each other, the impurity concentration of the P-type well layer 2 is slightly higher than $1\times10^{15}/cm^3$ that is the impurity concentration of the epitaxial layer 4, although this is not clear from FIG. 7. From this, it can be said that the junction concentration is higher than the impurity concentration of the epitaxial layer 4. Even with such a difference, the junction capacitance can be far increased than has been possible. That is, a 30 minutes or more heat treatment time facilitates a P-type impurity diffusion from the semiconductor substrate 1, thereby increasing the thickness of the P-type well layer 2. Note that the thermal diffusion of impurity is also influenced by "the type of the atmosphere gas (e.g., $N_2$ gas, Ar gas, dry $O_2$ gas, wet $O_2$ gas, and $NO/O_2$ gas), and "pressure (gas pressure)", in addition to "temperature" and "time."

On the other hand, FIG. 8 shows the impurity concentration distribution in the cross section taken along the line B—B in FIG. 1. That is, the impurity concentration distribution of the P-type well layer 5 is shown together with the impurity concentration distribution of the P-type well layer 2 as described above. From FIG. 8, it is found that as the heat treatment time is longer, the P-type well layer 2 is wider and thus the distance between the P-type well layer 2 and P-type well layer 5 is reduced.

Thus, the thickness of the P-type well layer 2 in FIG. 1 can be made greater as the heat treatment time is longer.

Referring again to FIGS. 7 and 8, the heat treatment time of 30 minutes is the time required for such a structure that a region where the impurity of the epitaxial layer 4 maintains its concentration distribution is present between the P-type well layer 2 and N-type bottom layer 7, and there is no PN junction resulting from the coexist of the impurities of the P-type well layer 2 and N-type bottom layer 7. That is, a heat treatment of about 30 minutes is generally performed in the step of forming the isolation insulating film 8. This treatment is however accompanied by that a P-type impurity layer due to the impurity diffusion from the semiconductor substrate 1 is formed at a position corresponding to the P-type well layer 2. The resistance of the P-type well layer 2 lowers as its thickness is greater, and the junction capacitance with the N-type bottom layer 7 is greater as the junction concentration is higher. With the heat treatment of about 30 minutes, however, the P-type well layer 2 cannot be so thick as to make contact with the N-type bottom layer 7, and the junction capacitance with the N-type bottom layer 7 is small, thus failing to obtain the effect of reducing the resistance value of the P-type well layer 5.

Figure 9:
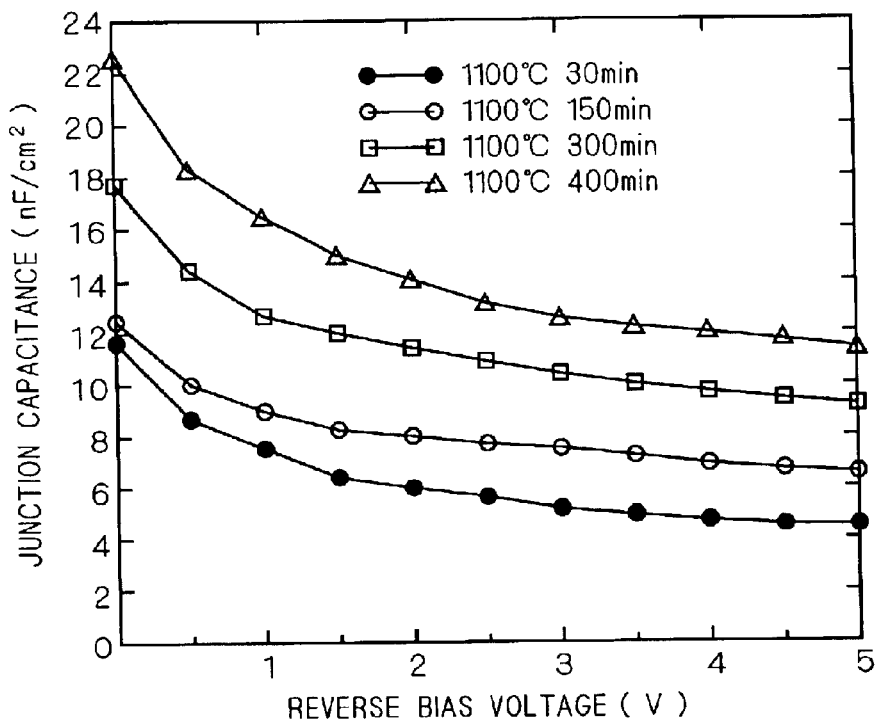
FIG. 9 is a diagram showing the results of simulation of junction capacity fluctuations in the semiconductor device.
Figure 10:
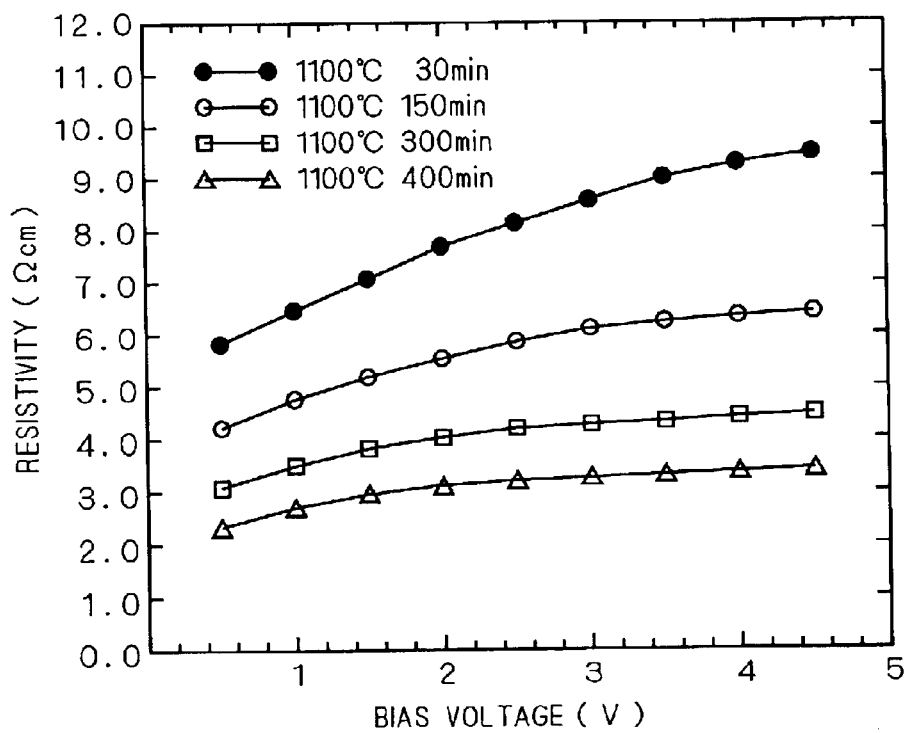
FIG. 10 is a diagram showing the results of simulation of resistivity in the semiconductor device.

FIG. 9 shows the result of simulations carried out, by heat treatment time, about the junction capacitance between the P-type well layer 2 and N-type bottom layer 7. FIG. 10 shows the result of simulations carried out, by heat treatment time, about the junction capacitance between the P-type well layer 2 and P-type well layer 5.

Specifically, FIG. 9 represents how junction capacitance ($nF/cm^2$) changes for various reverse bias voltages (V) applied to a junction between the P-type well layer 2 and N-type bottom layer 7, when heat treatment time is 30 minutes, 150 minutes, 300 minutes, and 400 minutes. In FIG. 9, graphs of dots, circles, squares, and triangles indicate the characteristics by the heat treatment times in the order named.

The followings can be found from FIG. 9. That is, as the reverse bias voltage increases, a depletion layer in the vicinity of the junction becomes larger and thus the junction capacitance decreases. As the thermal diffusion time is longer, the junction concentration is higher and thus the junction capacitance increases. At every reverse bias voltage, the junction capacitance is the largest with a 400-minute heat treatment, and the smallest with a 30-minute heat treatment.

FIG. 10 shows the results of simulations when a bias voltage is applied between the bottom of the P-type well layer 2 and the top of the P-type well layer 5. That is, FIG. 10 represents how resistivity (Ωcm) changes for various reverse bias voltages (V), when heat treatment time is 30 minutes, 150 minutes, 300 minutes, and 400 minutes. In FIG. 10, graphs of dots, circles, squares, and triangles indicate characteristics by the heat treatment times in the order named. Although each graph has a tendency that as the bias voltage increased, the resistivity increases, at every reverse bias voltage, the resistivity is the smallest with a 400-minute heat treatment and the largest with a 30-minute heat treatment.

Thus, when the heat treatment time is 150 minutes, 300 minutes, or 400 minutes, between the P-type well layer 2 and N-type bottom layer 7, there is no region where the impurity of the epitaxial layer 4 maintains its concentration distribution. In other words, the P-type well layer 2 and N-type bottom layer 7 are in contact and their impurities coexist to form a PN junction, which is a novel structure according to the present invention.

After the P-type well layer is formed, which is accompanied by the step of forming the isolation insulating film 8, the following conventional steps can be performed. For instance, to a main surface of the epitaxial layer 3 divided by the isolation insulating film 8, a selective ion implantation is performed to form an N-type well layer 4 and P-type well layers 5 and 6. Then, to the bottom of the P-type well layer, ion implantation is performed to form an N-type bottom layer 7. Thereafter, by conventional techniques, semiconductor elements such as a PMOS transistor MP1 and NMOS transistor MN1 are formed on the N-type well layer 4 and P-type well layer 5, respectively, as well as semiconductor elements forming memory cells on the P-type well layer 6.

A-4. Operation Effects

The operation effects of the DRAM 100 will be described by referring to FIGS. 1 and 2.

As stated above, increasing the thickness of the P-well layer 2 increases the junction capacitance C1 between the P-type well layer 2 and N-type bottom layer 7, thereby to suppress a voltage drop of the power supply wiring WR1 when the sense amplifier SA is operated.

That is, when the sense amplifier SA (FIG. 1) is operated, by turning on the PMOS transistor MP1, the wiring parasitic capacity C3 of the sense enable wiring SEp is added to the power supply wiring WR1 through the PMOS transistor MP1. This produces a temporal drop in the voltage VDDS (FIG. 2).

It is however capable of suppressing the voltage drop of the power supply wiring WR1 to maintain the voltage VDDS at a fixed value, because the charge stored in the junction capacitance C1 (that corresponds to the internal voltage VDD) is applied to the power supply wiring WR1 through the N-type bottom layer 7, epitaxial layer 3, N-type well layer 4, N-type impurity layer 45, and contact hole CH11. The current that follows at this time is the current 11 shown in FIG. 1.

In addition, increasing the P-type well layer 2 decreases the distance away from the P-type well layer 5 and reduces the resistance R2 of the P-type well layer 5, thereby suppressing a voltage buildup of the power supply wiring WR2 when the sense amplifier SA is operated.

That is, when the sense amplifier SA is operated, by turning on the NMOS transistor MN1, the wiring parasitic capacity C4 of the sense enable wiring SEn is added to the power supply wiring WR2 through the NMOS transistor MN1. This produces a temporal rise in the voltage GNDS (FIG. 2).

It is however capable of suppressing the voltage buildup of the power supply wiring WR2 to maintain the voltage GNDS at a fixed value, because the resistance R2 of the P-type well layer 5 is small and thus current flows from the power supply wiring WR2 to the semiconductor substrate 1 through the contact hole CH21, P-type impurity layer 55, P-type well layer 5, epitaxial layer 3, and P-type well layer 2. The current that follows at this time is the current 12 shown in FIG. 1. Note that the semiconductor substrate 1 is connected to the ground voltage GND.

Thus, in the DRAM 100 of the first preferred embodiment, the voltage VDDS and voltage GNDS to be applied to the sense amplifier SA can be maintained at a fixed value. This enables to maintain the drive capability of the transistors forming the sense amplifier SA and also minimize a delay time tRCD between reading when a word pulse is applied to a word line and sensing and discrimination of the information of a bit line.

As a result, the operation speed of the sense amplifier SA is maintained at a nearly designed value, thus preventing a drop in sense speed.

The delay time tRCD can be effectively reduced under the conditions expressed in the following equations (2) to (4):

$$Rpsub+Rpwell<Rmgnd \quad (2)$$

$$Rnwell+Rpwell<Rmvdd+Rmgnd \quad (3)$$

$$Cwell>CD(total) \quad (4)$$

Although in FIG. 1, the memory cells are arranged in the region where the P-type well layer 6 is formed (that is equivalent to the region where P-type well layer 2 is formed), it should be understood that this region be not limited to the region for memory cells. That is, if only the P-type well layer 2 is formed, any circuit having other function may be formed.

Although FIG. 1 illustrates the case of disposing the N-type bottom layer 7 only beneath the P-type well layer 6, it may also be disposed beneath the N-type well layer 4. In this instance, the junction capacitance C1 can be increased by making the thickness of the N-type well layer 4 equal to that of the P-type well layer 6 such that the N-type bottom layers 7 underlying the layers 4 and 6 are continuous with each other.

Although FIGS. 7 and 8 illustrate as example the simulation results of the impurity concentration distributions in the direction of the substrate depth, the thickness, boron concentration, heat treatment time, and heat treatment temperature of the epitaxial layer 3 are cited merely by way of example and without limitation.

Although the heat treatment of the P-type well layer 2 is performed by using the heat treatment for forming the isolation insulating film 8 (STI), it is also capable of using other heat treatment step using heat treatment temperatures from 900° C. to 1200° C.

Alternatively, ion implantation may be used to form the P-type well layer 2. That is, after forming the epitaxial layer 3 on the main surface of the semiconductor substrate 1, ion implantation is performed in the following manners. For example, when the epitaxial layer 3 has a thickness of 6 $\mu$m, boron is implanted at an energy of 4 MeV and in a dose of about $1\times10^{13}$ to $1\times10^{14}$/cm$^2$. When the epitaxial layer 3 has a thickness of 4 $\mu$m, boron is implanted at an energy of 3 MeV and in a dose of about $1\times10^{13}$ to $1\times10^{14}$/cm$^2$.

The boron ion implantation may be performed before or after forming the STI. In the case of implanting boron ion before forming the STI, the boron that is already introduced by the heat treatment for forming the STI is mainly diffused. At the same time as the boron diffusion, the boron atoms, which have been electrically inactive immediately after implantation, are activated by their move to the lattice positions of silicon crystals.

In the case of implanting boron ion after forming the STI, the implanted boron is thermally diffused by a heat treatment to be performed in forming a MOSFET, and is activated at the same time. An exemplary example of the heat treatment for forming the MOSFET is a heat treatment using RTA (rapid thermal annealing), after source/drain ion implantation. In the RTA, a heat treatment for 0.01 to 5 seconds is carried out in the temperature range of 900 to 1150° C., for example.

In this instance, the type of the substrate is not restricted to the semiconductor substrate 1 containing the P-type impurity at a relatively high concentration, and there can be used an epitaxial layer or semiconductor substrate, each containing a P-type impurity at a relatively low concentration (P$^-$). Alternatively, an epitaxial layer or semiconductor substrate containing an N-type impurity can be used.

The P-type impurity (P$^-$) of a relatively low concentration indicates that the concentration of boron is, for example, less than $1\times10^{16}$/cm$^3$, and the P-type impurity (P$^+$) of a relatively high concentration indicates that the concentration of boron is, for example, more than $1\times10^{18}$/cm$^3$. The concentrations from $1\times10^{16}$/cm$^3$ to $1\times10^{18}$/cm$^3$ are referred to simply as "P-type" or "P$^0$".

A-5. First Modification

In the DRAM 100 of the foregoing first preferred embodiment, the thickness of the P-type well layer 2 is the same in its entire region, as shown in FIG. 1. Whereas in a DRAM 100A of FIG. 11, there is a P-type well layer 2A that is different from the P-type well layer 2 in the following point. That is, the P-type well layer 2A has a larger thickness in the region for forming the P-type well layer 5 (the region for forming the NMOS) than the region for forming the N-type well layer 4 (the region for forming the PMOS).

Hereinafter, the thickness of the P-type well layer 2A in the memory cell region and PMOS formation region is referred to as "d1", and the region of thickness d1 is referred to as "the first region of the P-type well layer." Likewise, the thickness of the P-type well layer 2A in the NMOS formation region is referred to as "d2", and the region of thickness d2 is referred to as "the second region of the P-type well layer."

Otherwise, the configuration is the same as the DRAM 100 in FIG. 1. The same reference numerals have been retained for similar parts, and their description is omitted.

Thus, increasing the thickness of the P-type well layer 2A in the NMOS formation region reduces the distance away from the P-type well layer 5 and thus permits a further reduction in the resistance R2 of the P-type well layer 5. Thereby, when the sense amplifier SA is operated, the effect of suppressing the voltage buildup of the power supply wiring WR2 is improved and the voltage GNDS can be maintained at a fixed value.

The thickness of the P-type well layer 2A in the NMOS formation region can be increased by covering the area except for the NMOS formation region with a resist mask etc., and performing a selective ion implantation of boron to a position corresponding to the underside of the P-type well layer 5.

Specifically, as previously described in the first preferred embodiment, in the high temperature heat treatment for forming the isolation insulating film 8, boron is thermally diffused from the semiconductor substrate 1 containing the P-type impurity at a relatively high concentration. This results in the P-type well layer 2A having a thickness of d1 in the area other than the NMOS formation region. At this time, in the NMOS formation region, the boron subjected to the ion implantation is also thermally diffused and mixed with the boron thermally diffusing from the semiconductor substrate 1. It follows that two impurity layers are continuous with each other, resulting in the P-type well layer 2A having a thickness of d2.

The depth of the ion implantation is set to such a depth at which, when the implanted boron is thermally diffused, it can mix with the boron thermally diffusing from the semiconductor substrate 1.

The entire P-type well layer 2A can be formed by ion implantation. In this instance, the type of the substrate is not restricted to the semiconductor substrate 1 containing the P-type impurity at a relatively high concentration, and there can be used an epitaxial layer or semiconductor substrate, each containing a P-type impurity at a relatively low concentration (P$^-$). Alternatively, an epitaxial layer or semiconductor substrate containing an N-type impurity is usable.

A-6. Second Modification

In the foregoing first preferred embodiment and first modification, the DRAM 100 or DRAM 100A is formed on the semiconductor substrate 1 that is a bulk substrate. Instead of the bulk substrate, a SOI (silicon on insulator) substrate can be used to obtain such a configuration of a DRAM 100B as shown in FIG. 12.

Figure 12:
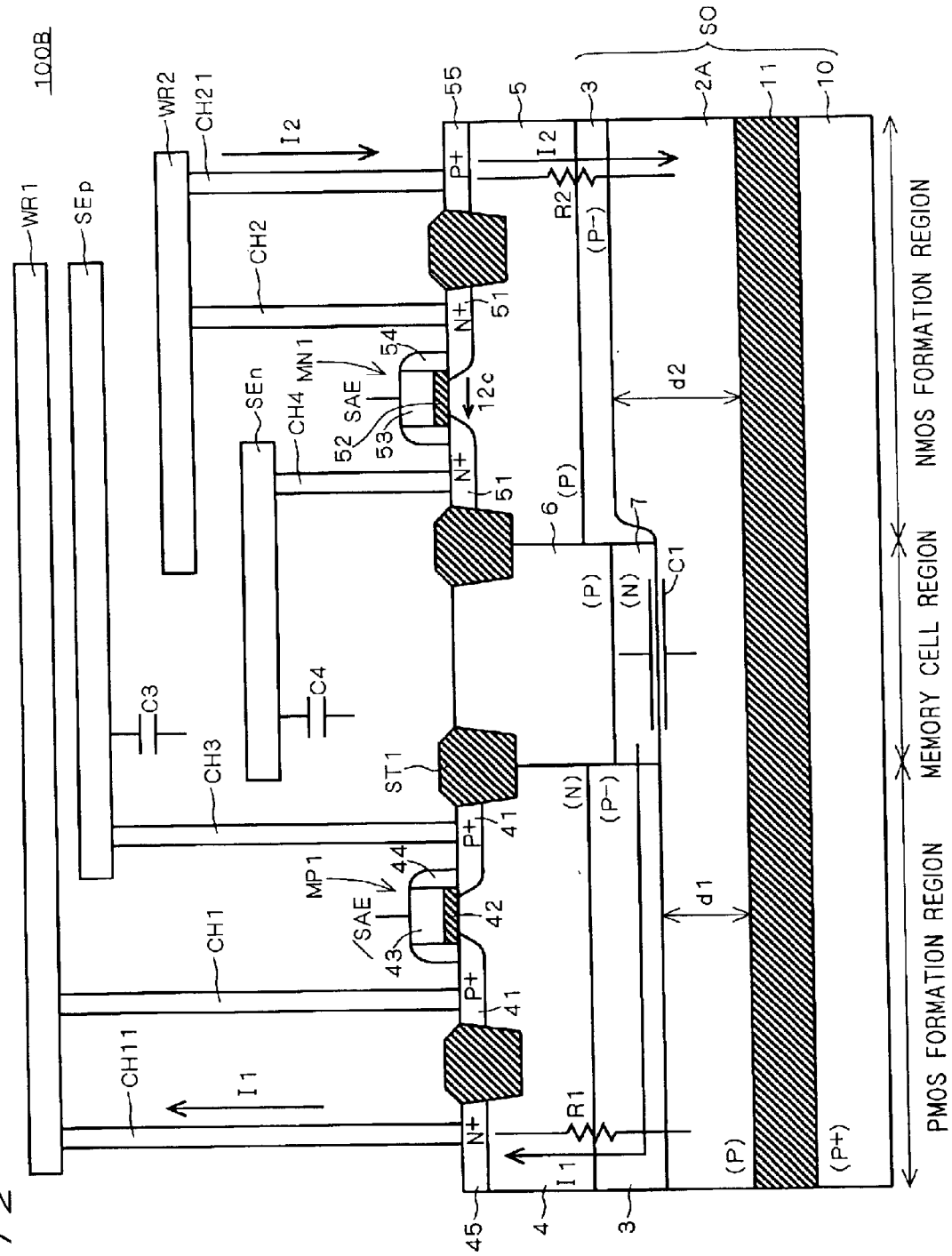

Referring to FIG. 12, a P-type well layer 2A is disposed so as to cover entirely a main surface of a buried insulating film 11 on a semiconductor substrate 10. The same reference numerals as in the DRAM 100 of FIG. 1 have been retained for similar parts, and their description is omitted.

A SOI substrate SO is made up of the buried insulating film 11 overlying the semiconductor substrate 10, and an epitaxial layer 3 that is disposed as a SOI layer on the buried insulating film 11.

It is of course possible to form the DRAM 100 of FIG. 1 on the SOI substrate SO.

In this instance, the P-type well layer 2A is electrically isolated from the semiconductor substrate 10, and therefore, a configuration for fixing the potential of the P-type well layer 2A is needed.

Its exemplary configuration is shown in FIG. 13, which illustrates only related parts, with the configuration of the DRAM 100B omitted.

Referring to FIG. 13, a plug layer 31 containing a P-type impurity at a relatively high concentration extends from a main surface of the epitaxial layer 3, through the layer 3, to the P-type well layer 2A.

An interlayer insulating film ZL overlies the epitaxial layer 3. A contact hole CH10 extends from a main surface of the interlayer insulating film ZL, through the film ZL, to the plug layer 31. The contact hole CH10 is connected to a wiring WR disposed on the interlayer insulating film ZL. With this configuration, the potential of the P-type well layer 2A can be fixed reliably.

By disposing the plug layer 31 for fixing the potential in a step portion in the P-type well layer 2A, that is, a boundary between the first and second regions of the P-type well layer, the first and second region can share the plug layer 31. This leads to the effect of reducing the area occupied, than when disposing an individual plug layer in the first and second regions.

Figure 11:
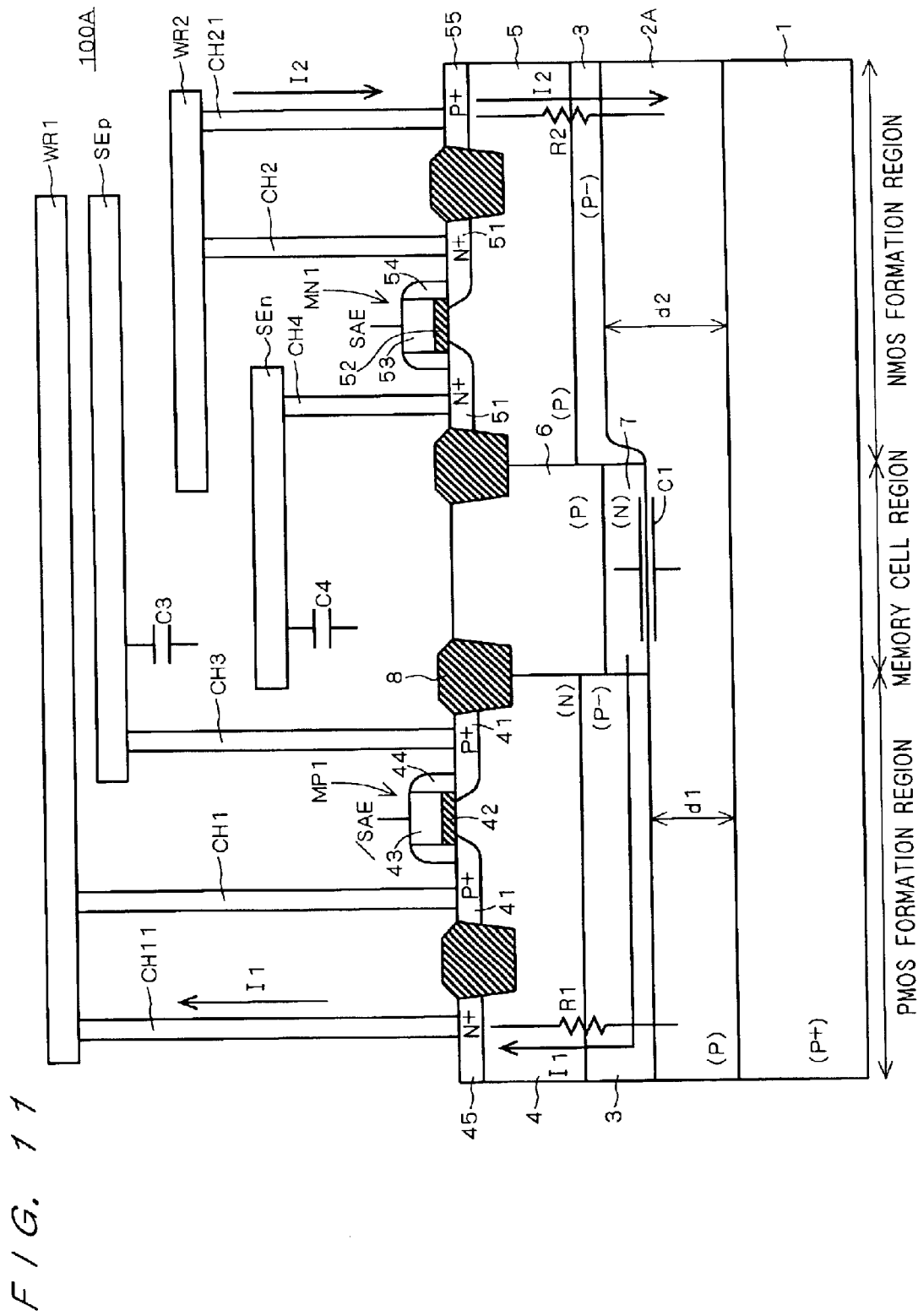
FIGS. 11 and 12 are sectional views showing the configuration of a modification of the semiconductor device.

Likewise, the DRAM 100A of FIG. 11 can incorporate the mentioned technique for fixing the potential. An exemplary is shown in FIG. 14.

Figure 14:
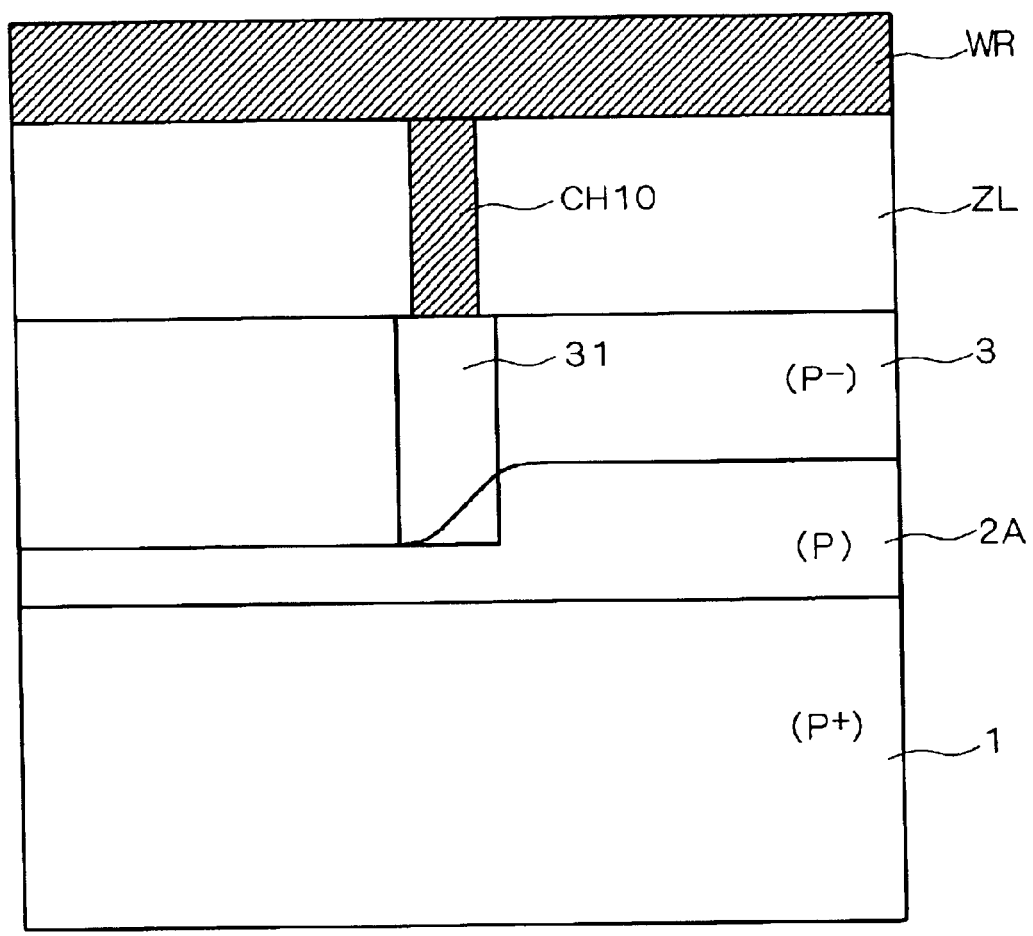

Referring to FIG. 14, a P-type well layer 2A is disposed on a semiconductor substrate 1 containing a P-type impurity at a relatively high concentration. Although the potential of the P-type well layer 2A can be fixed through the semiconductor substrate 1, the potential of the layer 2A is reliably fixed by arranging such that the potential fixing is also possible through the plug layer 31.

The position of the plug layer 31 can be disposed so as to make contact with the first and second regions of the P-type well layer, instead of being restricted to the boundary therebetween.

B. Second Preferred Embodiment

B-1. Device Configuration

In the foregoing first preferred embodiment, the DRAM is taken as example. The present invention is applicable to any semiconductor device requiring that the potential be reliably fixed, instead of being restricted to the power supply wiring for driving the sense amplifier of the DRAM.

Description will be made of an inverter 200 in FIG. 15, which is an exemplary semiconductor device according to a second preferred embodiment.

FIG. 15 is a diagram showing the circuit configuration of the inverter 200 made up of four inverters IV1, IV2, IV3, and IV4.

The inverter IV1 has a PMOS transistor P31 and NMOS transistor N31. The inverter IV2 has a PMOS transistor P32 and NMOS transistor N32. The inverter IV3 has a PMOS transistor P33 and NMOS transistor N33. The inverter IV4 has a PMOS transistor P34 and NMOS transistor N34.

In the inverters IV1 and IV3, each source electrode of the PMOS transistors P31 and P33 is connected to a power supply wiring WR11, and each drain electrode is connected to an inverter enable wiring VNL.

In the inverters IV2 and IV4, each source electrode of the PMOS transistors P32 and P34 is connected to an inverter enable wiring VPL, and each drain electrode is connected to a power supply wiring WR12.

The inverters IV1 to IV4 are connected in series, and a signal that is inputted from the inverter IV1 is outputted from the inverter IV4.

The power supply wiring WR11 is a wiring to which an internal voltage VDD is supplied, and is paired with the inverter enable wiring VPL. Both are electrically connected with each other through a PMOS transistor MP1 that is a driver transistor. To the gate electrode of the PMOS transistor MP1, an inverter drive signal /IE is applied.

A resistance Rp is present between the power supply wiring WR11 and inverter enable wiring VPL. The inverter enable wiring VPL has a wiring parasitic capacity C3.

The power supply wiring WR12 is a wiring to which a ground voltage GND is supplied, and is paired with the inverter enable wiring VNL. Both are electrically connected with each other through an NMOS transistor MN1 that is a driver transistor. To the gate electrode of the NMOS transistor MN1, an inverter drive signal IE is applied.

A resistance Rd is present between the power supply wiring WR12 and inverter enable wiring VNL. The inverter enable wiring VNL has a wiring parasitic capacity C4.

In the inverter 200 of this configuration, an input signal in a standby condition is set to Low. When in the standby condition, Low and High signals are respectively provided as inverter drive signals IE and /IE, the NMOS transistor MN1 and PMOS transistor MP1 are brought into an off state. As a result, the voltage of the inverter enable wiring VPL is lower than the internal voltage VDD, and the voltage of the inverter enable wiring VNL is higher than the ground voltage GND. In this state, the source voltages of transistors contained in the inverters IV1 to IV4, to which an off signal is applied as a gate input (hereat, the NMOS transistor N31, PMOS transistor P32, NMOS transistor N33, and PMOS transistor P34) exhibit a high potential to their respective carriers. That is, the source voltages are raised and sub-threshold currents are lowered, thereby reducing standby current. When the inverter 200 is operated, the NMOS transistor MN1 and PMOS transistor MP1 are in on state. Therefore, the voltage of the inverter enable wiring VPL is equal to the internal voltage VDD, and the voltage of the inverter enable wiring VNL is equal to the ground voltage GND.

When the subthreshold current flows in the standby state, the resistances Rp and Rd function to reduce the standby current by performing an operation of automatically raising the potentials of the inverter enable wirings VPL and VNL against the internal voltage VDD and ground voltage VND (negative feedback operation).

Figure 16:
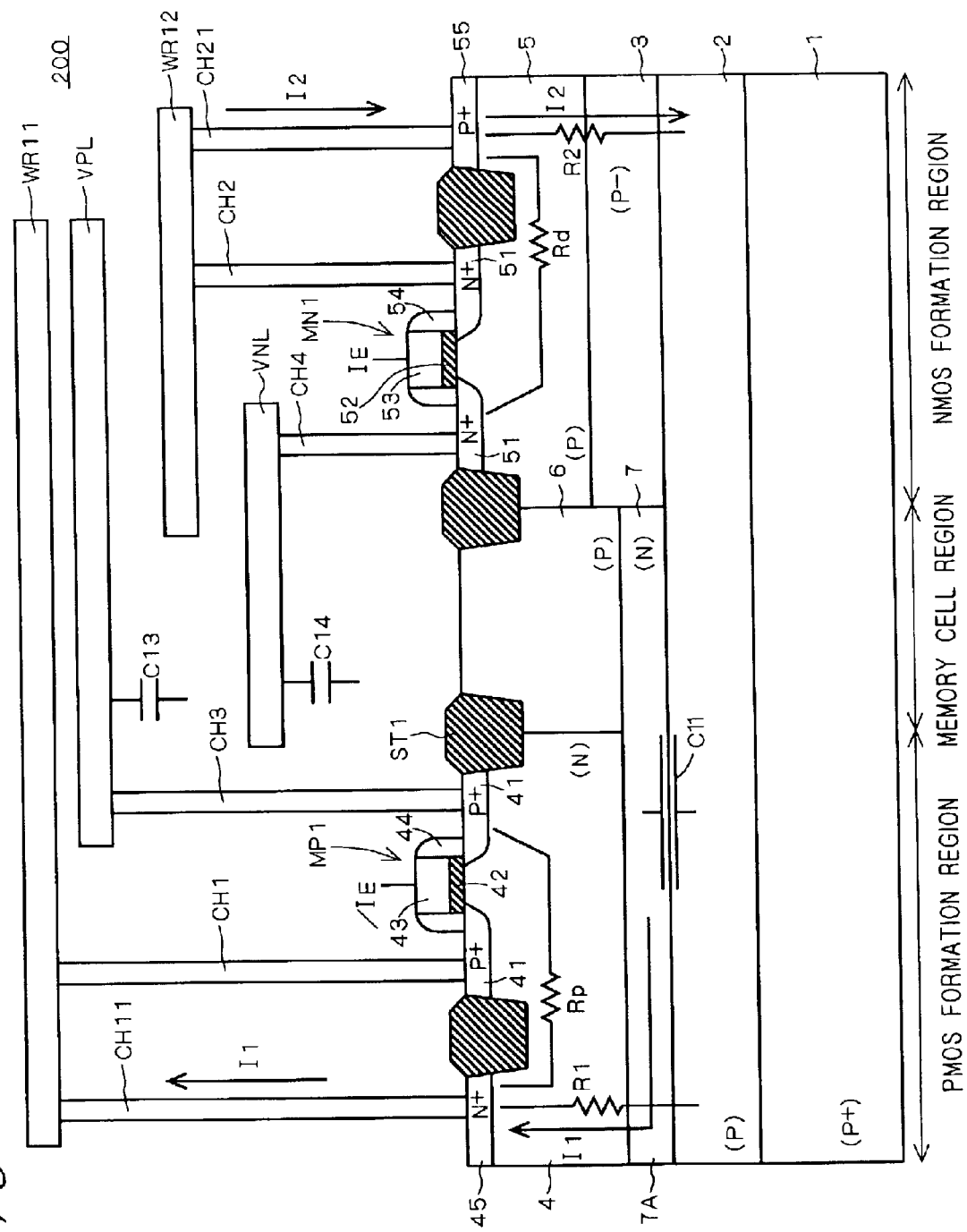
FIG. 16 is a sectional view showing a characteristic part of the semiconductor device of the second preferred embodiment.
Figure 17:
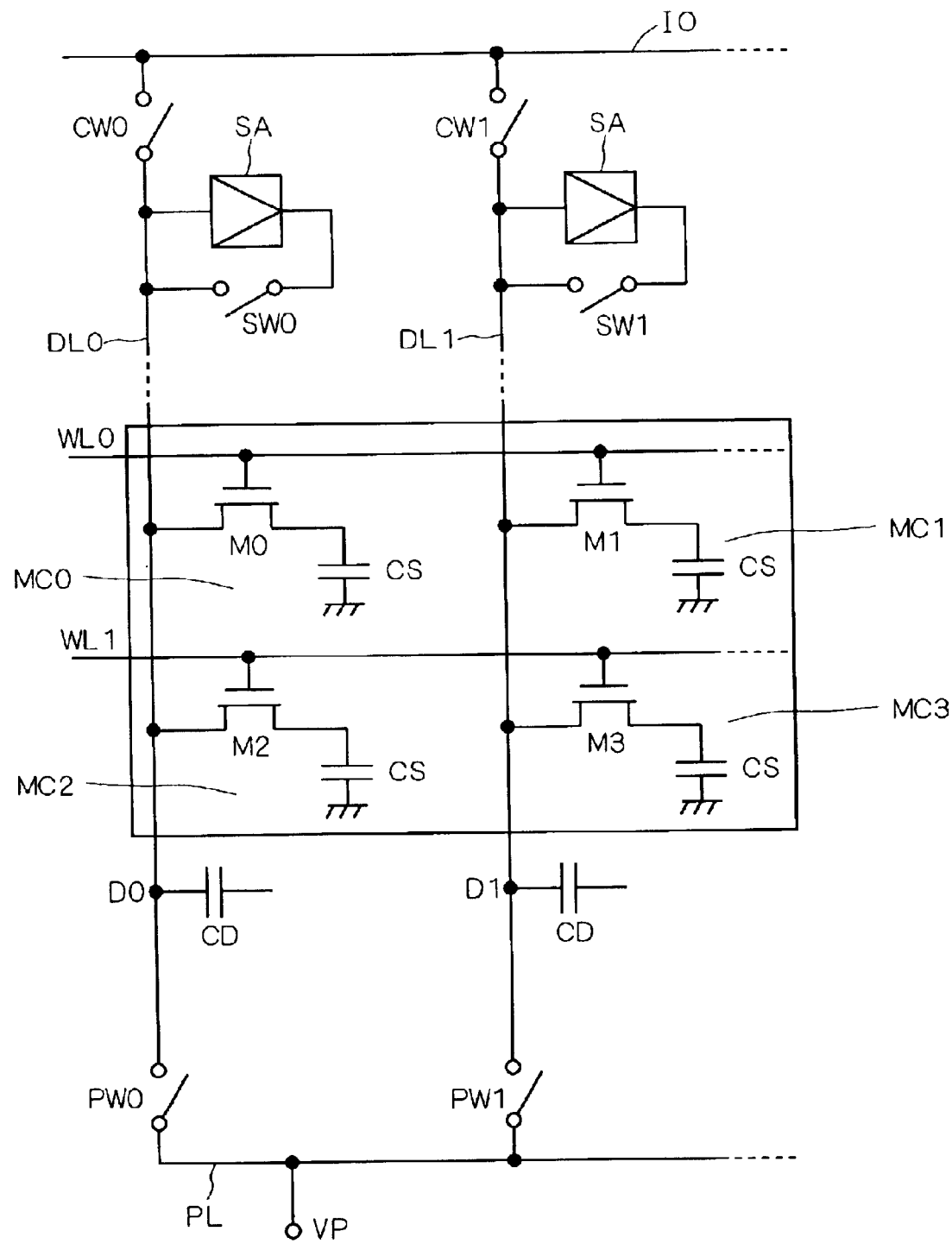
FIG. 17 is a diagram showing the circuit configuration of a DRAM of general one-transistor cell.
Figure 18:
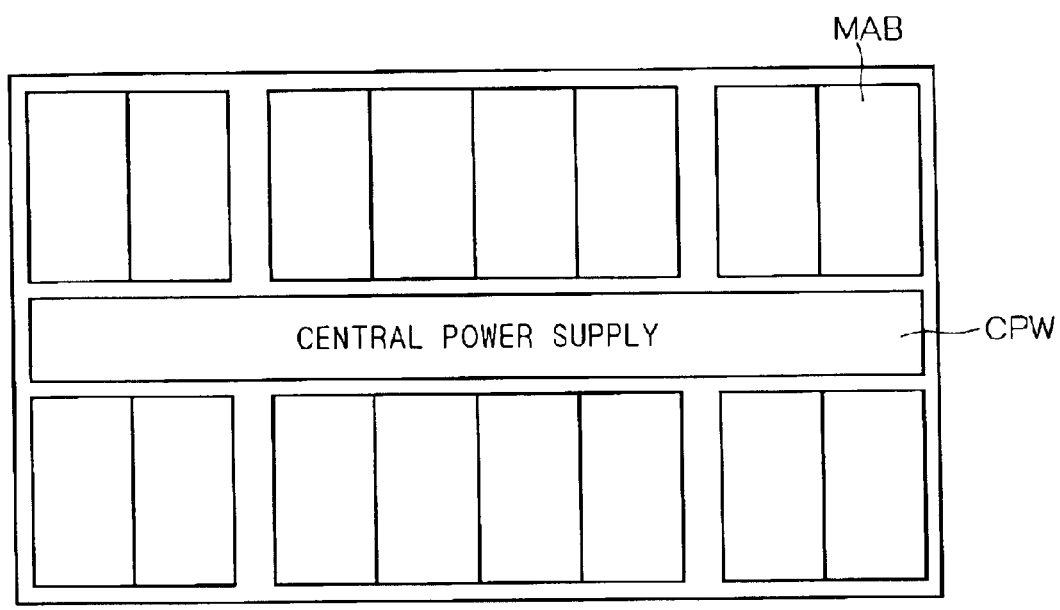
FIG. 18 is a diagram showing the overall configuration of the general DRAM.
Figure 19:
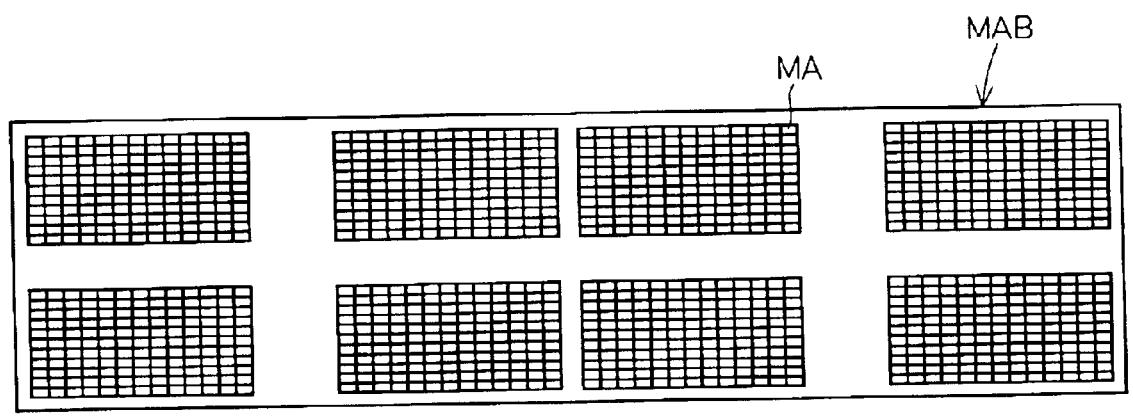
FIG. 19 is a diagram showing the overall configuration of a memory array block of the general DRAM.
Figure 20:
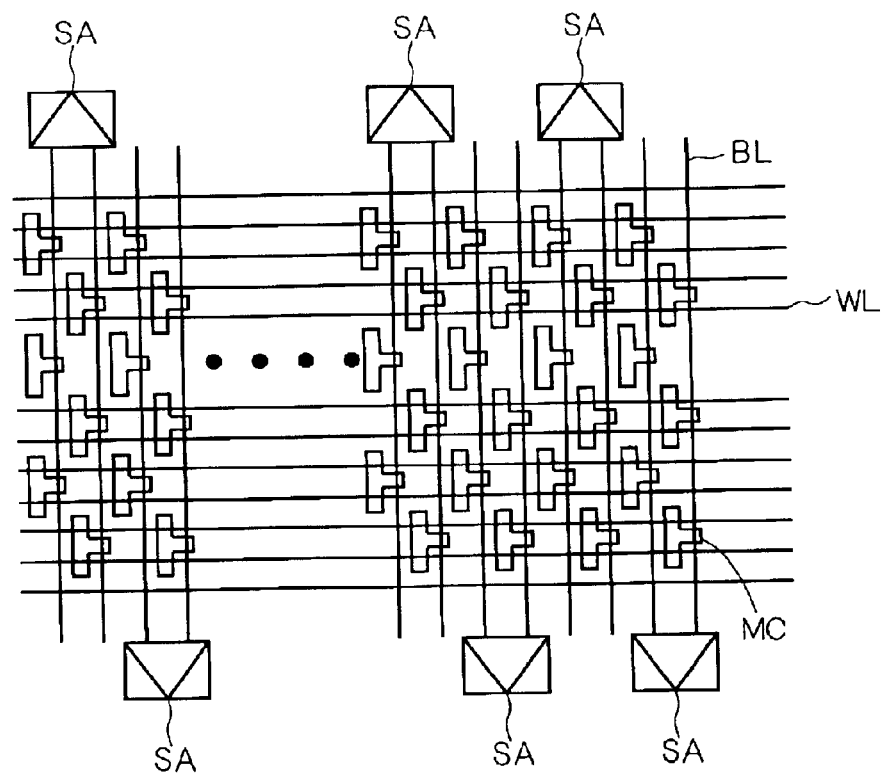
FIG. 20 is a diagram showing the configuration of a memory array of the general DRAM.

FIG. 16 shows the sectional configuration of a characteristic part of the inverter 200.

Referring to FIG. 16, in the inverter 200, a P-type well layer 2 containing a P-type impurity is disposed entirely on a main surface of a semiconductor substrate 1 containing a P-type impurity at a relatively high concentration (P$^+$). An epitaxial layer 3 containing a P-type impurity at a relatively low concentration (P$^-$) is disposed on the P-type well layer 2.

The area occupied by the epitaxial layer 3 is drawn to a small scale in FIG. 16. In fact, the semiconductor substrate 1 and the epitaxial layer 3 having a thickness of about 6 $\mu$m form an epitaxial substrate. The P-type well layer 2 is disposed in a main surface of the epitaxial layer 3, together with an N-type well layer 4 and P-type well layers 5 and 6.

In the main surface of the epitaxial layer 3, the N-type well layer 6 containing a P-type impurity is selectively disposed, and the N-type well layer 4 containing an N-type impurity and the P-type well layer 5 containing a P-type impurity are selectively disposed so as to sandwich therebetween the P-type well layer 6.

The N-type well layer 4 and P-type well layer 6 have approximately the same thickness. An N-type bottom layer 7A containing an N-type impurity is disposed beneath the layers 4 and 6 so as to make contact therewith. The P-type well layer 2 has such a thickness as to make contact with the N-type bottom layer 7A, and the N-type bottom layer 7A and P-type well layer 2 form a PN junction.

In main surfaces of the N-type well layer 4 and P-type well layer 5, an isolation insulating film 8 that is called STI is selectively disposed to define a region for forming a MOS transistor.

The region of the P-type well layer 6 is also defined by the isolation insulating film 8. An inverter is disposed in this region, which is therefore referred to as inverter region.

The P-type well layer 2 is formed by making the P-type impurity, e.g., boron (B), thermally diffuse from the semiconductor substrate 1 containing the P-type impurity at a relatively high concentration, for example, in a high temperature heat treatment for forming the isolation insulating film 8.

In a region to be defined by the isolation insulating film 8 in the N-type well layer 4, there are a pair of source/drain layers 41 containing a P-type impurity at a relatively high concentration. A gate insulating film 42 is disposed on opposed end portions of the source/drain layers 41 and on the N-type well layer 4 locating between the source/drain layers 41. A gate electrode 43 overlies the gate insulating film 42. A sidewall insulating film 44 is disposed on the side surfaces of the gate insulating film 42 and gate electrode 43, resulting in a PMOS transistor MP1. An inverter drive signal /IE is applied to the gate electrode 43 of the PMOS transistor MP1.

In a region to be defined by the isolation insulating film 8 in the P-type well layer 5, there are a pair of source/drain layers 51 containing an N-type impurity at a relatively high concentration (N$^+$). A gate insulating film 52 is disposed on opposed end portions of the source/drain layers 51 and on the P-type well layer 5 locating between the source/drain layers 51. A gate electrode 53 overlies the gate insulating film 52. A sidewall insulating film 54 is disposed on the side surfaces of the gate insulating film 52 and gate electrode 53, resulting in an NMOS transistor MN1. An inverter drive signal IE is applied to the gate electrode 53 of the PMOS transistor MN1.

Hereinafter, the region where the PMOS transistor is formed is referred to as "PMOS formation region," and the region where the NMOS transistor MN1 is formed is referred to as "NMOS formation region."

An interlayer insulating film (not shown) is disposed so as to cover above the semiconductor substrate 1, as well as above the PMOS transistor MP1 and NMOS transistor MN1. A variety of wirings are disposed in the interlayer insulating film.

That is, one of the paired source/drain layers 41 is electrically connected to a power supply wiring WR11 through a contact hole CH1 disposed in the interlayer insulating film. The other is electrically connected to an inverter enable wiring VPL through a contact hole CH3 disposed in the interlayer insulating film.

One of the paired source/drain layers 51 is electrically connected to a power supply wiring WR12 through a contact hole CH2 disposed in the interlayer insulating film. The other is electrically connected to an inverter enable wiring VNL through a contact hole CH4 disposed in the interlayer insulating film.

An N-type impurity layer 45 containing an N-type impurity at a relatively high concentration is selectively disposed in the N-type well layer 4. The power supply wiring WR11 is also electrically connected to the N-type impurity layer 45 through a contact hole CH1.

Likewise, a P-type impurity layer 55 containing a P-type impurity at a relatively high concentration is selectively disposed in the P-type well layer 5. The power supply wiring WR12 is also electrically connected to the P-type impurity layer 55 through a contact hole CH21.

In FIG. 16, a variety of capacitance components and resistance components are schematically illustrated. Specifically, reference character C11 indicates the junction capacitance between the P-type well layer 2 and N-type bottom layer 7, C13 indicates the wiring parasitic capacity of the inverter enable wiring VPL, C14 indicates the wiring parasitic capacity of the inverter enable wiring VNL, R11 indicates the resistance of the N-type well layer 4, and R12 indicates the resistance of the P-type well layer 5. A portion of the N-type bottom layer 7 (not shown in FIG. 16) is connected to the internal voltage VDD, and therefore, the junction capacitance C11 can store charge that corresponds to the internal voltage VDD.

B-2. Device Operation

When the inverter 200 transits from the standby state to operating state, it is necessary that the voltage of the inverter enable wiring VPL be equal to the internal voltage VDD, and that the voltage of the inverter enable wiring VNL be equal to the ground voltage GND. Since the wiring parasitic capacity C13 is present on the inverter enable wiring VPL, by turning on the PMOS transistor MP1, the wiring parasitic capacity C13 is added to the power supply wiring WR11 through the PMOS transistor MP1. It follows that charge is stored in the wiring parasitic capacity C13, and thus the internal voltage lowers.

The ground voltage GND is supplied to the power supply wiring WR12. Since the wiring parasitic capacity C14 is present on the inverter enable wiring VNL, by turning on the NMOS transistor MN1, the wiring parasitic capacity C14 is added to the power supply wiring WR12 through the NMOS transistor MN1. It follows that the charge stored in the wiring parasitic capacity C14 is fed to the power supply wiring WR12 and thus the ground voltage rises.

Such fluctuations in the internal voltage VDD and ground voltage GND cause the problem that the inverters IV1 to IV4 will not operate normally. This problem is however avoidable by positively using the junction capacitance C11 between the P-type well layer 2 and N-type bottom layer 7A.

B-3. Operation Effects

Operation effects of the inverter 200 will be described by referring to FIGS. 15 and 16.

As described in the first preferred embodiment, increasing the thickness of the P-type well layer 2 increases the junction capacitance C11 between the P-type well layer 2 and N-type bottom layer 7A, and thus suppress a voltage drop of the power supply wiring WR11 when the inverter 200 is operated.

That is, when the inverters IV1 to IV4 (FIG. 15) are operated, by turning on the PMOS transistor MP1, the wiring parasitic capacity C13 of the inverter enable wiring VPL is added to the power supply wiring WR11 through the PMOS transistor MP1. This causes a temporal drop in the internal voltage VDD (FIG. 15).

It is however capable of suppressing the voltage drop of the power supply wiring WR11 to maintain the internal voltage VDD at a fixed value, because the charge stored in the junction capacitance C11 is fed to the power supply wiring WR11 through the N-type bottom layer 7A, N-type well layer 4, N-type impurity layer 45, and contact hole CH11. The current that follows at this time is the current 11 shown in FIG. 16. Note that a portion of the N-type bottom layer 7A (not shown in FIG. 16) is connected to the internal voltage VDD.

In addition, increasing the P-type well layer 2 decreases the distance away from the P-type well layer 5 and reduces the resistance R12 of the P-type well layer 5, thereby suppressing a voltage buildup of the power supply wiring WR12 when sense amplifiers are operated.

That is, when the inverters IV1 to IV4 are operated, by turning on the NMOS transistor MN1, the wiring parasitic capacity C14 of the inverter enable wiring VNL is added to the power supply wiring WR12 through the NMOS transistor MN1. This produces a temporal rise in the ground voltage GND (FIG. 15).

It is however capable of suppressing the voltage buildup of the power supply wiring WR12 to maintain the ground voltage GND at a fixed value, because the resistance R12 of the P-type well layer 5 is small and thus current flows from the power supply wiring WR12 to the semiconductor substrate 1 through the contact hole CH21, P-type impurity layer 55, P-type well layer 5, epitaxial layer 3, and P-type well layer 2. The current that follows at this time is the current 12 shown in FIG. 16. Note that the semiconductor substrate 1 is connected to the ground voltage GND.

Thus, in the inverter 200 of the second preferred embodiment, at the time of transition from the standby state to operating state, the internal voltage VDD and ground voltage GND to be applied to the inverters IV1 to IV4 can be maintained at a fixed value. This allows for that the inverters IV1 to IV4 operate normally.

Referring again to FIG. 16, the N-type bottom layer 7A of the inverter 200 is present continuously beneath the P-type well layer 6 and N-type well layer 4, thereby producing a large junction capacitance C11.

C. Applications of the Invention

Although the foregoing first and second preferred embodiments are related to the case of applying the present invention to the DRAM or inverter, the invention is useful for semiconductor devices requiring that the potential of power supply wiring (including ground wiring) be maintained constant. For example, the invention is applicable to an NAND circuit, NOR circuit, XOR circuit, SRAM memory cell, transmission gate, and domino logic circuit. The same effect is obtainable when the configuration of the invention is applied to the following circuit system that an internal voltage VDD and ground voltage GND are supplied when activating an arbitrary circuit, such as an analog circuit, RF (radio frequency) circuit, or digital circuit, and neither is supplied when the arbitrary circuit is in the standby state.

The first preferred embodiment is related to the configuration for maintaining constant the potential of the power supply wiring (including the ground wiring) of the sense amplifier used in the DRAM. However, the configuration of the sense amplifier is not limited to that shown in FIG. 2, and applications of the invention is not limited to sense amplifiers used in DRAMs.

For instance, the invention is applicable to a sense amplifier mounted on a semiconductor device such as a SRAM, flush memory, EEPROM, MRAM (magnetic random access memory), or NROM (nitride read only memory). The same effect is produced by this application.

The "MRAM" and "NROM" will be briefly described below. In the MRAM, magnetic tunnel junction (MTJ), which is obtained by sandwiching an insulator between two ferromagnetic materials, is used for memory elements. By external magnetic field, it is controlled such that two ferromagnetic materials of magnetic tunnel junction elements forming a memory cell have magnetization in the same direction or opposite directions. Data is stored by associating the state of the same direction magnetization and the state of the opposite direction magnetization with "0" and "1", respectively. Data is written by changing the direction of magnetization of one of the ferromagnetic materials with a magnetic field that is generated by allowing current to flow a predetermined word line and bit line.

In the NROM, a portion corresponding to a gate insulating film of a MOS transistor is a multilayer film called ONO film, which is made up of a silicon oxide film, silicon nitride film, and silicon oxide film. An individual 1-bit information is stored at two different locations in the silicon nitride film of the ONO film by performing interchange between the voltage applied to the drain layer and the voltage applied to the source layer, in the state that a predetermined positive voltage is applied to a gate electrode.

This technique utilizes the characteristic that the electrons stored in the silicon nitride film are less liable to diffuse in a lateral direction (the direction of a gate length) in the silicon nitride film.

Information is read based on whether a channel current flows or not when applying an appropriate voltage to the drain layer and source layer. Interchange between the voltage applied to the drain layer and the voltage applied to the source layer is performed depending on whether an information storage location in the silicon nitride film, i.e., the location where electrons are present locally, is on the side of the source layer or drain layer.

Information is erased in the following manner. In the state that a predetermined positive voltage is applied to the gate electrode, after interchange between the voltage applied to the drain layer and the voltage applied to the source layer, the corresponding voltage is supplied to the source layer and drain layer. Thereby, holes are introduced into the silicon nitride film and the electrons stored therein are erased.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
    a main semiconductor layer of a first conductivity type disposed entirely on a main surface of a semiconductor substrate and having above it plural wiring layers;
    a first semiconductor layer of the first conductivity type disposed in a first main surface of said main semiconductor layer;
    a second semiconductor layer of the first conductivity type and a third semiconductor layer of a second conductivity type disposed in said first main surface of said main semiconductor layer and are adjacent to said first semiconductor layer so as to sandwich therebetween said first semiconductor layer;
    a fourth semiconductor layer of the second conductivity type disposed in an inner part of said main semiconductor layer beneath said first semiconductor layer so that it makes contact with at least a bottom surface of said first semiconductor layer; and
    a fifth semiconductor layer of the first conductivity type disposed in a second main surface of said main semiconductor layer,
    said fifth semiconductor layer disposed in such a thickness as to form a PN junction with said fourth semiconductor layer,
    said plural wiring layers having:
    a first power supply wiring to which a first voltage is supplied; and
    a second power supply wiring to which a second voltage lower than said first voltage is supplied,
    said third semiconductor layer electrically connected to said first power supply wiring, and
    said second semiconductor layer electrically connected to said second power supply wiring,
    wherein said main semiconductor layer corresponds to an epitaxial layer of an epitaxial substrate, and
    said fifth semiconductor layer is disposed so as to cover entirely said main surface of said semiconductor substrate.

2. The semiconductor device according to claim 1 wherein
    said first and third semiconductor layers have the same thickness, and
    said fourth semiconductor layer is disposed so as to contact a bottom surface of said third semiconductor layer.

3. The semiconductor device according to claim 1 wherein
    said fifth semiconductor layer is divided into a first region corresponding to a layer below said first semiconductor layer and a second region corresponding to a layer below said second semiconductor layer, and
    said second region has a larger thickness than said first region and is disposed so as to project toward said second semiconductor layer.

4. The semiconductor device according to claim 3 further comprising:
    a plug layer of the first conductivity type extending through said second semiconductor layer and said main semiconductor layer to a boundary between said first and second regions of said fifth semiconductor layer, said second voltage being applied through said plug layer to said fifth semiconductor layer.

5. The semiconductor device according to claim 1 wherein said first and second power supply wirings are wirings to supply a drive power supply of a sense amplifier.

6. The semiconductor device according to claim 1 wherein said first and second power supply wirings are wirings to supply a drive power supply of an inverter.

7. A semiconductor device comprising:
    a main semiconductor layer of a first conductivity type disposed entirely on a main surface of a semiconductor substrate and having above it plural wiring layers;
    a first semiconductor layer of the first conductivity type disposed in a first main surface of said main semiconductor layer;
    a second semiconductor layer of the first conductivity type and a third semiconductor layer of a second conductivity type disposed in said first main surface of said main semiconductor layer and are adjacent to said first semiconductor layer so as to sandwich therebetween said first semiconductor layer;
    a fourth semiconductor layer of the second conductivity type disposed in an inner part of said main semiconductor layer beneath said first semiconductor layer so that it makes contact with at least a bottom surface of said first semiconductor layer; and
    a fifth semiconductor layer of the first conductivity type disposed in a second main surface of said main semiconductor layer,
    said fifth semiconductor layer disposed in such a thickness as to form a PN junction with said fourth semiconductor layer,
    said plural wiring layers having:

a first power supply wiring to which a first voltage is supplied; and a second power supply wiring to which a second voltage lower than said first voltage is supplied, said third semiconductor layer electrically connected to said first power supply wiring, said second semiconductor layer electrically connected to said second power supply wiring, wherein said main semiconductor layer corresponds to a SOI layer of a SOI substrate, and said fifth semiconductor layer is disposed so as to cover entirely a main surface of a buried insulating film underlying a layer below said SOI layer.

8. The semiconductor device according to claim 7 wherein said first and third semiconductors have the same thickness, and said fourth semiconductor layer is disposed so as to make contact with a bottom surface of said third semiconductor layer.

9. The semiconductor device according to claim 7 wherein said fifth semiconductor layer is divided into a first region corresponding to a layer below said first semiconductor layer and a second region corresponding to a layer below said second semiconductor layer, and said second region has a larger thickness than said first region and is disposed so as to project toward said second semiconductor layer.

10. The semiconductor device according to claim 9 further comprising:

a plug layer of the first conductivity type extending through said second semiconductor layer and said main semiconductor layer to a boundary between said first and second regions of said fifth semiconductor layer, said second voltage being applied through said plug layer to said fifth semiconductor layer.

11. The semiconductor device according to claim 7 wherein said first and second power supply wirings are wirings to supply a drive power supply of a sense amplifier.

12. The semiconductor device according to claim 7 wherein said first and second power supply wirings are wirings to supply a drive power supply of an inverter.

13. A method of manufacturing a semiconductor device, said semiconductor device comprising:

a main semiconductor layer of a first conductivity type being disposed entirely on a main surface of a semiconductor substrate and having above it plural wiring layers;

a first semiconductor layer of the first conductivity type selectively disposed in a first main surface of said main semiconductor layer;

a second semiconductor layer of the first conductivity type and a third semiconductor layer of a second conductivity type that are selectively disposed in said first main surface of said main semiconductor layer and are adjacent to said first semiconductor layer so as to sandwich therebetween said first semiconductor layer;

a fourth semiconductor layer of the second conductivity type selectively disposed in an inner part of said main semiconductor layer beneath said first semiconductor layer so that it makes contact with at least a bottom surface of said first semiconductor layer; and a fifth semiconductor layer of the first conductivity type disposed in a second main surface of said main semiconductor layer, said method comprising the steps of:

(a) preparing, as said semiconductor substrate, a substrate having impurity of the first conductivity type at a relatively high concentration; and (b) forming said main semiconductor layer on entirely said main surface of said semiconductor substrate, and then heating, before forming said first to fourth semiconductor layers, said semiconductor substrate at temperatures in the range of 900° C. to 1200° C. for 30 minutes or more, so that impurity of the first conductivity in said semiconductor substrate is allowed to diffuse to form said fifth semiconductor layer.

14. The method of manufacturing a semiconductor device according to claim 13 wherein said step (b) is also used as the step of selectively forming an isolation insulating film in said first main surface of said main semiconductor layer.

15. The method of manufacturing a semiconductor device according to claim 13 wherein the time of heating said semiconductor substrate is from 150 minutes to 400 minutes.

16. A method of manufacturing a semiconductor device, said semiconductor device comprising:

a main semiconductor layer of a first conductivity type being disposed entirely on a main surface of a semiconductor substrate and having above it plural wiring layers;

a first semiconductor layer of the first conductivity type selectively disposed in a first main surface of said main semiconductor layer;

a second semiconductor layer of the first conductivity type and a third semiconductor layer of a second conductivity type that are selectively disposed in said first main surface of said main semiconductor layer and are adjacent to said first semiconductor layer so as to sandwich therebetween said first semiconductor layer;

a fourth semiconductor layer of the second conductivity type selectively disposed in an inner part of said main semiconductor layer beneath said first semiconductor layer so that it makes contact with at least a bottom surface; of said first semiconductor layer; and a fifth semiconductor layer of the first conductivity type disposed in a second main surface of said main semiconductor layer, said method comprising the step of:

forming said main semiconductor layer on entirely said main surface of said semiconductor substrate, and then performing, before forming said first to fourth semiconductor layers, ion implantation of impurity of the first conductivity type to the entire surface of said main semiconductor layer, thereby to form said fifth semiconductor layer.

* * * * *